(12) United States Patent
Komura et al.

(10) Patent No.: US 6,956,777 B2
(45) Date of Patent: Oct. 18, 2005

(54) SEMICONDUCTOR MEMORY DEVICE AND CONTROL METHOD THEREOF

(75) Inventors: Kazufumi Komura, Kasugai (JP); Satoru Kawamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 525 days.

(21) Appl. No.: 10/299,775

(22) Filed: Nov. 20, 2002

(65) Prior Publication Data

US 2003/0202413 A1   Oct. 30, 2003

(30) Foreign Application Priority Data

Apr. 26, 2002  (JP) .............................. 2002-127552

(51) Int. Cl.[7] .............................................. G11C 29/00
(52) U.S. Cl. ............ 365/200; 365/185.09; 365/189.05; 365/189.12; 365/191; 365/222
(58) Field of Search ................................ 365/200, 222, 365/185.09, 189.05, 189.12, 191

(56) References Cited

U.S. PATENT DOCUMENTS 6,118,710 A * 9/2000 Tsuji .......................... 365/200

FOREIGN PATENT DOCUMENTS

JP          11-120790        4/1999

* cited by examiner

Primary Examiner—Anh Phung
Assistant Examiner—Pho M. Luu
(74) Attorney, Agent, or Firm—Arent Fox PLLC

(57) ABSTRACT

There are intended to provide a semiconductor memory device capable of data access with higher speed and improvement of data transfer rate by shortening refresh operation cycle by stable low-current-consumption operation, and a control method of such a semiconductor memory device. In advance to the refresh operation mode signal M(I), control signal SW is outputted. Consequently, the switching sections select stored address bus Ladd from each storing section and stored-redundancy-judgment-result bus LJ and output address information subject to refresh operation to a word-line-driving-system circuit. After the address information from each storing section is outputted, a control signal LCH is outputted. As a result, an address switching section selects refresh address bys Add(I) subject to next refresh operation and each storing section stores address Add(I) fetched in an internal address bus IAdd and its redundancy judgment result RJ(I).

33 Claims, 19 Drawing Sheets

CIRCUIT BLOCK DIAGRAM OF FIRST SPECIFIC EXAMPLE DIRECTED TO SECOND EMBODIMENT

FIG. 1  CIRCUIT BLOCK DIAGRAM OF FIRST EMBODIMENT

FIG. 2 CIRCUIT BLOCK DIAGRAM OF SPECIFIC EXAMPLE DIRECTED TO FIRST EMBODIMENT

FIG. 3 OPERATIONAL WAVEFORM DIAGRAM OF FIRST EMBODIMENT

FIG. 5  MODIFICATION OF FIRST EMBODIMENT

FIG. 6  LAYOUT EXAMPLE OF FIRST EMBODIMENT

FIG. 7  CIRCUIT BLOCK DIAGRAM OF FIRST SPECIFIC EXAMPLE DIRECTED TO SECOND EMBODIMENT

FIG. 8 CIRCUIT BLOCK DIAGRAM OF SECOND SPECIFIC EXAMPLE DIRECTED TO SECOND EMBODIMENT

FIG. 9
REFRESH OPERATION TIME SHORTENED EFFECT ACCORDING TO SECOND EMBODIMENT
(PRIOR ART)
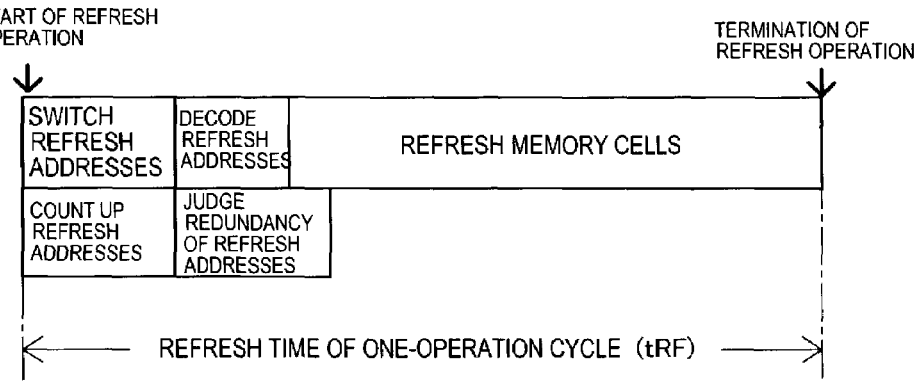
(FIRST EMBODIMENT)
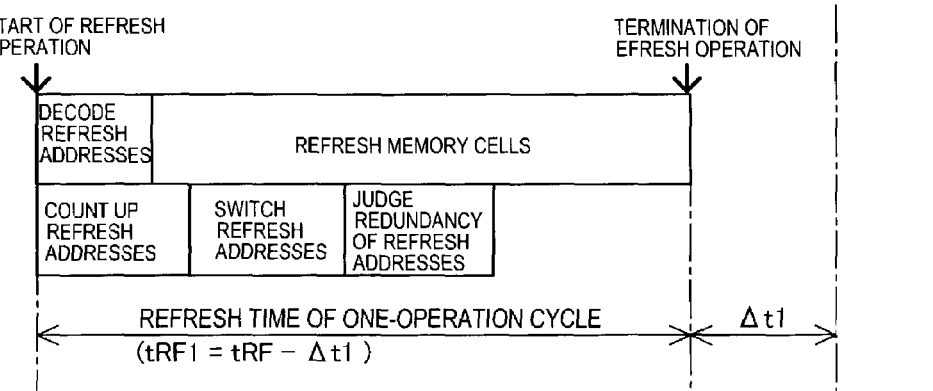
(SECOND EMBODIMENT)
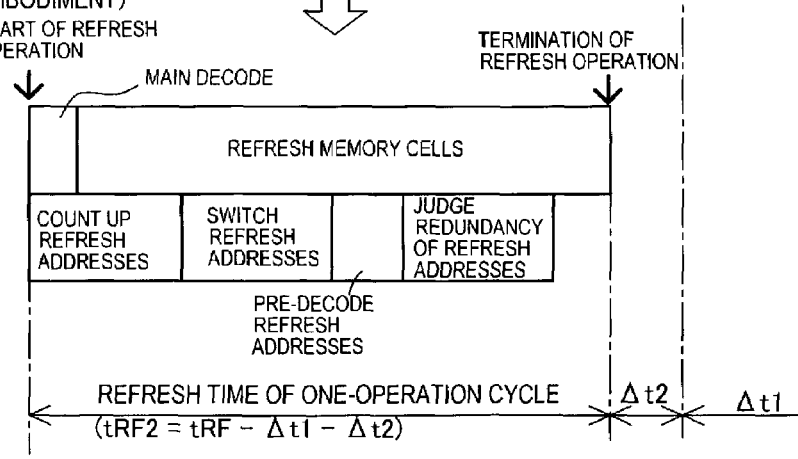

FIG. 10  LAYOUT EXAMPLE OF SECOND EMBODIMENT

FIG. 11 CIRCUIT BLOCK DIAGRAM OF THIRD EMBODIMENT

FIG. 12 CIRCUIT BLOCK DIAGRAM OF SPECIFIC EXAMPLE DIRECTED TO THIRD EMBODIMENT

FIG. 16 CIRCUIT BLOCK DIAGRAM OF FOURTH EMBODIMENT

SPECIFIC EXAMPLE OF THINNING-OUT CONTROL CIRCUIT

OPERATIONAL WAVEFORM DIAGRAM OF FOURTH EMBODIMENT

CIRCUIT BLOCK OF PRIOR ART

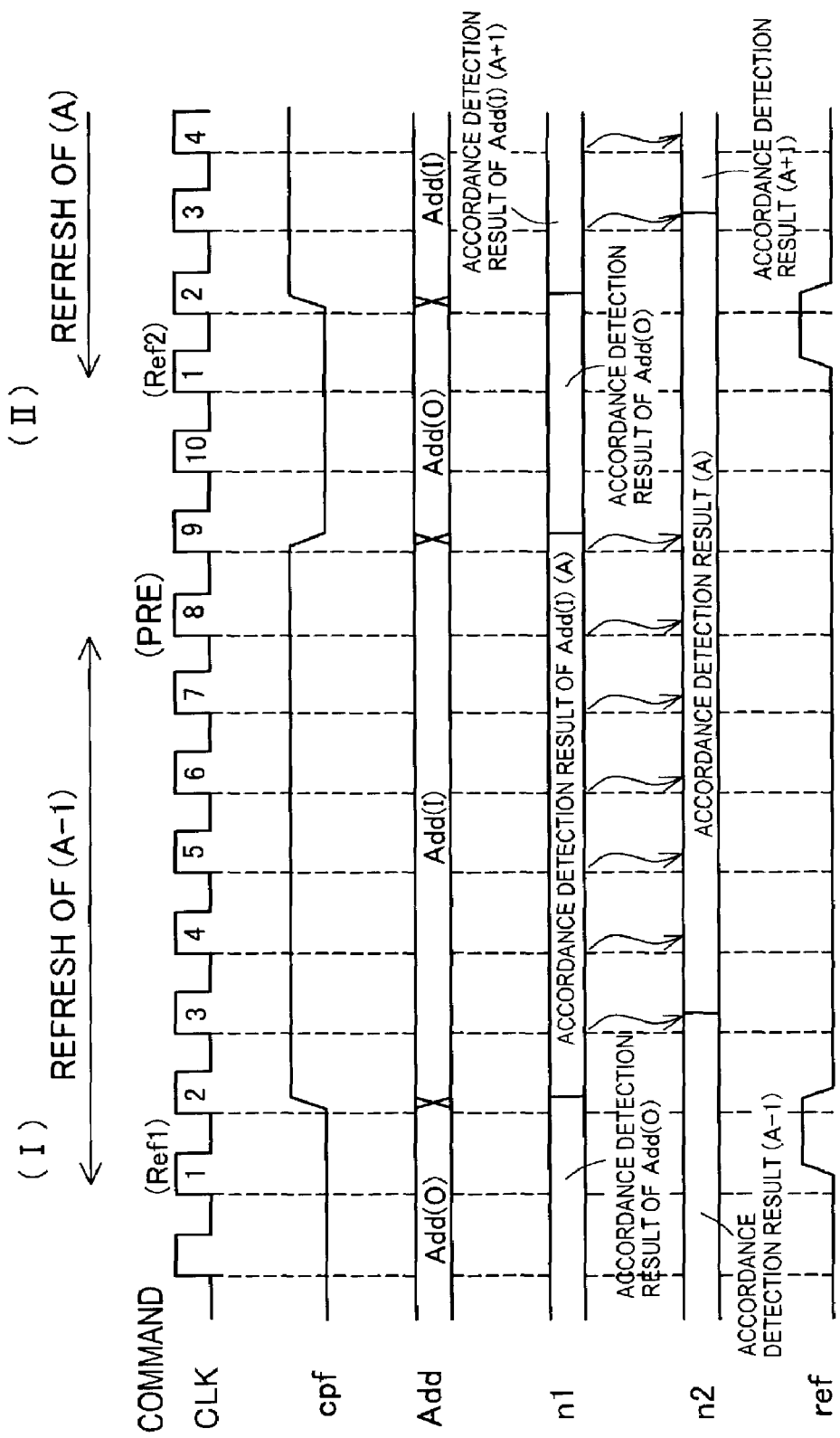
FIG. 20 PRIOR ART OPERATIONAL WAVEFORM DIAGRAM OF PRIOR ART

SEMICONDUCTOR MEMORY DEVICE AND CONTROL METHOD THEREOF

BACKGROUND OF THE INVENTION

1. Field of the Invention

The present invention relates to a semiconductor memory device having a refresh operation and its control method, and particularly relates to a semiconductor memory device able to realize the shortening of a refresh operation time by a low current consumption operation, and its control method.

2. Description of Related Art

In recent years, functions required in a portable device are increased as the portable device is spread. As a result, a semiconductor memory of larger capacity is required instead of a static random access memory (hereinafter abbreviated as an SRAM) conventionally mounted. Therefore, a DRAM having a refresh function therein and called a pseudo-SRAM begins to be used. In this DRAM, while highly integrated DRAM memory cells are used in comparison with an SRAM memory cell, no external control circuit of a refresh controller, etc. is required by building-in control relative to a refresh operation peculiar to the DRAM memory cell. The DRAM has a data access operation equal to that of the SRAM.

In the pseudo-SRAM, both a data access operation cycle externally controlled by setting a data access operation and a pre-charge operation subsequent to this data access operation to one-operation cycle, and a refresh operation cycle internally controlled by setting the refresh operation and a pre-charge operation subsequent to this refresh operation to one-operation cycle are independently executed at any time. Therefore, it is necessary that the refresh operation cycle concurs with the data access operation cycle, and the refresh operation cycle is interrupted in the continuous data access operation cycle. Namely, the refresh operation cycle is executed irrespective of the request of the data access operation cycle controlled by the exterior. Accordingly, it is necessary to shorten the refresh operation cycle to increase the speed of the data access operation or improve a data transfer rate.

Here, in the refresh operation cycle, the refresh operation is performed with respect to the memory cells corresponding to refresh address Add (I) outputted by a built-in address counter, etc. In the data access operation cycle, the data access operation is performed with respect to the memory cell corresponding to a data access address Add (O) inputted from the exterior.

FIG. 19 shows a prior art for shortening the refresh operation cycle. FIG. 19 shows a circuit block diagram having a redundancy judgment circuit 700c of a third embodiment disclosed in JP Laid-Open Patent Publication No. 11-120790. FIG. 19 shows a circuit block for selecting the data access address Add (O) or the refresh address Add (I), and supplying the selected address to an address decoder 300 through an address register 400.

The redundancy judgment circuit 700c has the following construction. The data access address Add(O) is inputted to an input terminal A of a selector circuit 760, and the refresh address Add(I) is inputted to an input terminal B. An internal command signal cpf is inputted to a selection-control-signal input terminal SB of the selector circuit 760. An output signal n00 of the selector circuit 760 is inputted to an accordance detector circuit 770 together with a redundant address. An output signal n100 of the accordance detector circuit 770 is inputted to an input terminal D of a flip-flop 780 and an input terminal A of a selector circuit 790. Operation timing of the flip-flop 780 is controlled in accordance with a clock signal CLK. The internal command signal cpf is also inputted to a load input terminal LD, and its output signal n200 is inputted to an input terminal B of the selector circuit 790. An internal command signal ref is inputted to the selection-control-signal input terminal SB of the selector circuit 790.

The address register 400 has the following construction. Each of the data access address Add(O) and the refresh address Add(I) is inputted to one end of a selection switch. Both the other ends of the selection switches are connected to a latch circuit constructed by an inverter gate, etc. An output from the latch circuit is connected to the address decoder 300 through an inverter gate for adjusting a logic level and arranged in accordance with necessity. The operation of the selection switch is controlled by an output signal of the redundancy judgment circuit 700c.

FIG. 20 shows operational waveforms. When the internal command signal ref is changed to a high level after a first cycle of the clock signal CLK for starting the refresh operation cycle (Ref1) is started, the input terminal B of the selector circuit 790 is selected, and a signal n200 as the accordance detection result of a redundant judgment at an (A-1) address is outputted. In the case of the detection result in which the (A-1) address is not conformed to the redundant address, the operation of the selection switch of the address register 400 is controlled by the outputted signal n200 and an unillustrated control signal of a refresh operation mode, and the refresh address Add(I) is fetched.

After a second cycle of the clock signal CLK is started, the internal command signal ref is changed to a low level so that the selector circuit 790 is non-activated. Further, the internal command signal cpf is changed to the high level, and the input terminal B of the selector circuit 760 is selected. Thus, the refresh address Add(I) of the (A) address already counted up is fetched to the accordance detector circuit 770, and the accordance detection result is outputted as an output signal n100. The accordance detection result of the output signal n100 obtained at this time is a result with respect to the (A) address. This result is fetched to the flip-flop 780 in synchronization with the rise of a third cycle of the clock signal CLK. The accordance detection result of the refresh address Add(I) of the (A) address fetched to the flip-flop 780 is taken-out after the first cycle of the clock signal CLK as a starting cycle of the refresh operation (Ref2) of the next cycle is started.

Here, the internal command signal cpf is a signal for controlling which address of the data access address Add(O) and the refresh address Add(I) is selected in the redundancy judgment circuit 700c. In a low level state, the data access address Add(O) is selected. In a high level state, the refresh address Add(I) is selected. Accordingly, the internal command signal cpf is a signal for performing signal transition approximately in synchronization with each operation cycle. Namely, the internal command signal cpf is set to the low level state in the data access operation cycle, and is set to the high level state in the refresh operation cycle.

The accordance detection with the redundant address is performed prior to one-operation cycle with respect to the refresh address Add(I) provided by the refresh operation, and no accordance detection operation is performed at a refresh operation cycle time.

However, in the prior art shown in FIGS. 19 and 20, the selection switch within the address register 400 is selected by the high level transition of the internal command signal ref after the refresh operation is started. The address path of the refresh address Add(I) to the address register 400 is then established. Therefore, the rewriting of a latch section within the address register 400 is performed after there fresh operation is started. In a semiconductor memory such as the pseudo-SRAM, etc. having an operation specification in which the data access operation mode and the refresh operation mode are independently required, there is a case in which the data access operation cycle is set before the refresh operation cycle is started. In this case, it is necessary to perform the switching operation of the selection switch. No latch operation of the refresh address Add(I) to the address register 400 can be precedently performed although the refresh address Add(I) in the refresh operation cycle of the next cycle is precedently decided. Accordingly, a problem exists in that no time of the refresh operation cycle can be shortened.

When an operation request of the refresh operation mode and an operation request of the data access operation mode are simultaneously generated, the data access operation cycle is performed after the termination of the refresh operation cycle in the operation specification for preferentially performing the refresh operation cycle. Since no refresh operation cycle is shortened, a problem exists in that no data access time is shortened and no data access at high speed can be realized. Further, a cycle time constructed by the refresh operation cycle and the data access operation cycle as one pair, and a cycle time constructed by the refresh operation cycle and continuous plural data access operation cycles as one set cannot be shortened when the case of an operation specification for preferentially executing the data access operation cycle is included. Accordingly, a problem exists in that no data transfer rate can be improved.

In the flip-flop 780 of the redundancy judgment circuit 700c, the internal command signal cpf changed to the high level is received after the rise of the clock signal CLK of the second cycle in the refresh operation cycle (Ref1), and the fetch operation of the signal n100 is repeatedly performed every rising transition of the clock signal CLK of third to ninth cycles during a refresh operation period. In the refresh operation, the activation of a word line, the differential amplification of a bit line pair, the subsequent non-activation of the word line, and equalization of the bit line pair are performed. At this time, many memory cells are connected to the word line and the bit line to be operated, and wiring length is very long. Therefore, a large amount of load capacity must be charged and discharged as the sum total of parasitic capacity and wiring capacity, and a peak electric current at charging and discharging times becomes large. Since the fetch operation of the signal n100 is repeatedly performed, the possibility that the accordance detector circuit 770, the flip-flop 780, etc. are badly influenced by changes in power voltage, ground voltage, etc. due to the large peak electric current becomes large. Accordingly, changes in voltage level of the signal n100 and circuit threshold value level are caused. Therefore, a problem exists in that there is a fear of the generation of an error latch to the flip-flop 780.

In the prior art, to perform the data access operation at high speed, the internal command signal cpf becomes the low level in a pre-charge period (PRE) (the ninth cycle of the clock signal CLK) after the refresh operation cycle (Ref1) is terminated. The selector circuit 760 is changed to the selecting state of the data access address Add(O). The internal command signal ref is also maintained in the low level state. Thus, if discordance is detected in the accordance detector circuit 770, the data access address Add(O) is latched to the address register 400 through the selector circuit 790. However, the effective data access address Add(O) is inputted after the data access operation cycle is started. Hence, the data access address Add(O) in this case is not effective address information. Accordingly, when the next cycle is the data access operation cycle or the refresh operation cycle (Ref2) (see FIG. 20), it is necessary to rewrite the latch information of the address register 400 and again perform the accordance detection in the accordance detector circuit 770. The unnecessary accordance detecting operation with the redundant address and the address latch operation are performed by the invalid data access address Add(O) inputted during the effective operation period. Therefore, a problem exists in that no electric current consumption can be reduced. The unnecessary electric current consumption is inevitably increased by increases in address bit number and redundant construction. This problem is increasingly caused as an increase in capacity is developed.

Further, a semiconductor memory having a so-called thinning-out refresh function is proposed. In this semiconductor memory, a memory cell having preferable data storing characteristics is set such that no refresh operation is performed every refresh request, and one refresh operation is performed every predetermined number of times. The consumed electric current at the refresh operation time is reduced by reducing the number of refresh operation times per predetermined time. However, in the prior art, the accordance detection operation with the redundant address is also precedently performed with respect to the refresh address Add(I) at which the thinning-out is performed and no refresh operation is performed. Accordingly, a problem exists in that no electric current consumption can be reduced by the unnecessary circuit operation. Further, a problem also exists in that the unnecessary circuit operation is increased since the redundant construction is increased as the increase in capacity is developed.

SUMMARY OF THE INVENTION

Accordingly, it is an object of the present invention to provide a semiconductor memory device capable of data access with higher speed, and improvement of data transfer rate by shortening refresh operation cycle with stable low-current-consumption operation, and a control method of such a semiconductor memory device.

To achieve the object, according to one aspect of the present invention, there is provided a semiconductor memory device equipped with a first operation mode that conducts an access operation when a first address is designated as object of access at every address access and a second operation mode that conducts an access operation in asynchronous with the first operation mode when a second address is designated as object of access at every address access in accordance with a predetermined procedure, wherein the semiconductor memory device comprises: an address storing section for storing the second address to be designated in next time of the second operation mode in accordance with a control signal generated in advance of the next time of the second operation mode, the address storing section being connected to an internal address bus; a redundancy-judgment-result storing section for storing a redundancy judgment result of the second address to be designated in the next time of the second operation mode in accordance with the control signal generated in advance of the next time of the second operation mode, the redundancy-judgment-result storing section being connected to a redundancy-judgment-result bus;

a first switching section for selecting the internal address bus or the address storing section when the access operation is made in the first operation mode or the second operation mode; and a second switching section for selecting the redundancy-judgment-result bus or the redundancy-judgment-result storing section when the access operation is made in the first operation mode or the second operation mode.

In the semiconductor memory device according to one aspect of the present invention, the first switching section selects either the first address on the internal address bus or the second address previously stored in the address storing section when address access is made in the first operation mode or the second operation mode, and the second switching section selects either a redundancy judgment result with respect to the first address on the redundancy-judgment-result bus or a redundancy judgment result with respect to the second address previously stored in the redundancy-judgment-result storing section. The second address for the next performance of the second operation mode and its redundancy judgment result are transferred from the internal address bus and the redundancy-judgment-result bus and stored in the address storing section and the redundancy-judgment-result storing section prior to the next second operation mode.

Furthermore, there is provided a control method of a semiconductor memory device according to the one aspect of the present invention, the semiconductor memory device being equipped with a first operation mode where first address as object of access is designated with respect to each access to execute access operation, and a second operation mode where second address as object of access is designated with respect to each access to execute access operation executed in asynchronous with the first operation mode in accordance with predetermined steps, the control method comprising: access-objective selecting step for selecting either the first address and a redundancy judgment result of the first address or the second address and a redundancy judgment result of the second address previously stored, as object of access for the first operation mode or the second operation mode; and operation-objective storing step for previously storing the second address and the redundancy judgment result of the second address as object of access for next time of the second operation mode after selecting the second operation mode in the access-objective selecting step.

Thereby, the second address as an access object can be established prior to the second operation mode as the next second operation mode with respect to the second address sequentially assigned in a predetermined order determined in advance. Accordingly, it is possible to previously store the second address in the next second operation and a redundancy judgment result in which the redundancy judgment is made with respect to the second address. Therefore, when the second operation mode is started, it is not necessary to perform the establishing operation of the second address, establishing operation of the redundancy judgment operation of the second address, and the establishing operation of the redundancy judgment operation. Accordingly, the operation period of the second operation mode can be shortened.

Furthermore, the cycle time can be shortened in case the first operation mode and the second operation mode are set to a pair of access operations. When the second operation mode is set to be prior, the access time in the first operation mode can be shortened. Further, when the second operation mode is performed in accordance with necessity between the first operation modes, occupancy ratio of the first operation modes can be improved.

Still further, there is provided a semiconductor memory device according to another aspect of the present invention, there is provided a semiconductor memory device equipped with an external access operation mode executed based on an external access request from an external and internal access operation mode executed based on an internal access request automatically generated in the internal, the external access operation mode and the internal access operation mode being executed a synchronously, wherein the semiconductor memory device comprises: an arbiter section for arbitrating between the external access request and the internal access request and outputting an external-operation-mode signal or an internal-operation-mode signal in accordance with the external access operation mode or the internal access operation mode; a mode judgment section for outputting at least two kinds of signals, namely, a first control signal controlled in advance and a second control signal controlled posterior to the first control signal, based on the external-operation-mode signal or the internal-operation-mode signal; an address switching section for selecting address of either external address controlled by the second control signal and set in the external access operation mode or internal address generated in the internal access operation mode in accordance with predetermined process and outputting selected address to an internal address bus; a redundancy judgment section for outputting a redundancy judgment result with respect to either one of the internal address or the external address in the internal address bus to a redundancy-judgment-result bus; an address storing section for storing the internal address in accordance with the second control signal, the address storing section being connected to the internal address bus; a redundancy-judgment-result storing section for storing the redundancy judgment result in accordance with the second control signal, the redundancy-judgment-result storing section being connected to the redundancy-judgment-result bus; a first switching section for selecting the internal address bus or the address storing section in accordance with the first control signal; and a second switching section for selecting the redundancy-judgment-result bus or the redundancy-judgment-result storing section in accordance with the first control signal.

In the semiconductor memory device according to another aspect of the present invention, the first switching sections elects either the internal address on the internal address bus or the internal address previously stored in the address storing section when access is made in the external access operation mode or the internal access operation mode, and the second switching section selects either a redundancy judgment result with respect to the internal address on the redundancy-judgment-result bus or a redundancy judgment result with respect to the internal address stored in the redundancy-judgment-result storing section by the second control signal. The second address for the next performance of the internal access operation mode and its redundancy judgment result are transferred from the internal address bus and the redundancy-judgment-result bus and stored in the address storing section and the redundancy-judgment-result storing section prior to the next internal access operation mode.

Thereby, the internal address as an access object can be established prior to the internal access operation mode as the next internal access operation mode with respect to address sequentially assigned in a predetermined order determined in advance. Accordingly, it is possible to previously store the internal address in the next internal address operation mode and a redundancy judgment result in which the redundancy judgment is made with respect to the internal address. Therefore, when the internal access operation mode is started, it is not necessary to perform the establishing operation of the internal address, redundancy judgment operation of the internal address, and the establishing operation of the redundancy judgment operation. Accordingly, the operation period of the internal access operation mode can be shortened.

Furthermore, the cycle time can be shortened in case the external access operation mode and the internal access operation mode are set to a pair of access operations. When the internal access operation mode is set to be prior, the access time in the external access operation mode can be shortened. Further, when the internal access operation mode is performed in accordance with necessity between the external access operation modes, occupancy ratio of the external access modes can be improved.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 9 shows refresh operation time shortened effect according to the Second Embodiment;

FIG. 20 is an operational waveform diagram of Prior Art.

DETAILED DESCRIPTION OF THE PREFERRED EMBODIMENTS

First to fourth embodiments for embodying a semiconductor memory device of the present invention and its control method will next be explained in detail with reference to the drawings on the basis of FIGS. 1 to 18.

Figure 1:
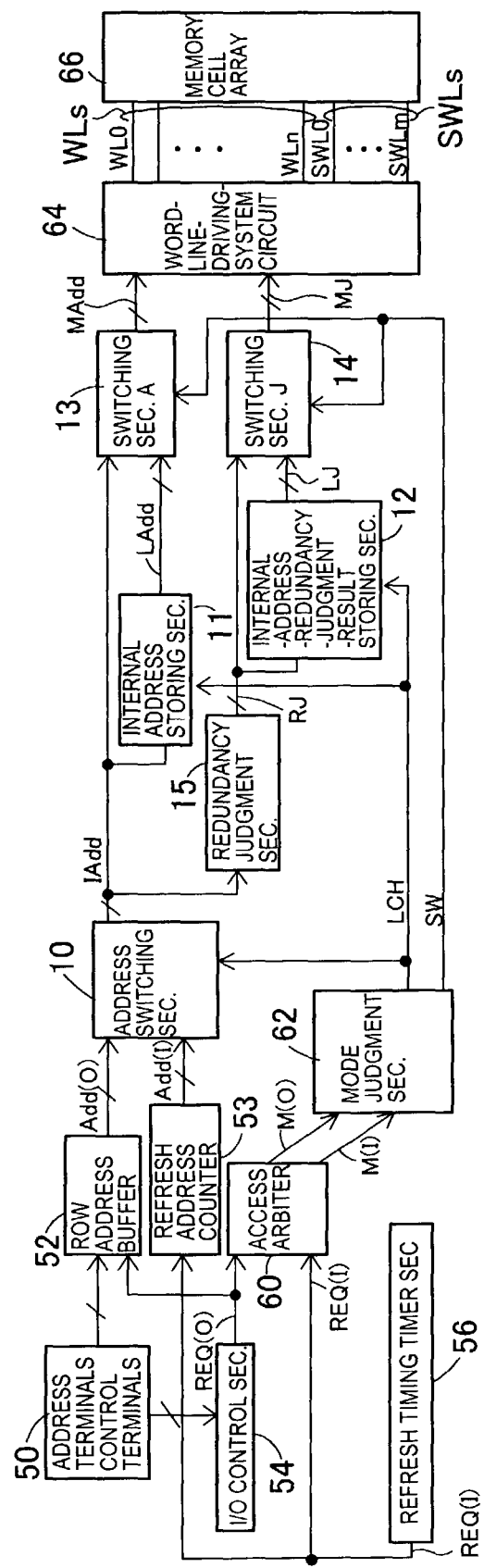
FIG. 1 is a circuit block diagram of a First Embodiment.

A first embodiment shown in FIG. 1 is a case in which the present invention is applied to the semiconductor memory device of an operation specification for mutually independently performing a built-in refresh operation and a data access operation from the exterior in timing of occasion demands. Since a refresh operation mode and a data access operation mode can be mutually independently operated, no external controller for the refresh operation is required, and interchangeability with an SRAM such as a pseudo-SRAM, etc. is set to be more perfect in the semiconductor memory device. FIG. 1 shows only a portion relative to a row address system.

Predetermined control terminals 50 are connected to an I/O control section 54, and output an external-access request signal REQ (O) in accordance with control signals inputted from the control terminals 50. The external-access request signal REQ(O) is transmitted to a row address buffer 52 together with address signals inputted from the address terminals 50 of a predetermined bit number, and a data access address Add(O) is outputted to an address switching section 10.

A refresh request signal REQ(I) outputted from a built-in refresh timing timer section 56 every predetermined time is inputted to a refresh address counter 53. A refresh address Add(I) is inputted from the refresh address counter 53 to the address switching section 10.

The external-access request signal REQ(O) outputted from the I/O control section 54 is inputted to an access arbiter 60 together with the refresh request signal REQ(I). The access arbiter 60 can detect the before and after of a signal between the generated request signals by detecting level transition of the request signals REQ(O), REQ(I) inputted as a level signal or a pulse signal. The access arbiter 60 outputs a data-access-mode signal M(O) to a mode judgment section 62 as a detecting result of the before and after of the signal when the external-access request signal REQ(O) is preferential, and also outputs a refresh operation mode signal M(I) to the mode judgment section 62 as the detecting result when the refresh request signal REQ(I) is preferential.

In the mode judgment section 62, control signals LCH, SW are outputted in accordance with the inputted operation mode signals M(O), M(I). The control signal LCH is inputted to the address switching section 10 to perform control for switching an address to be supplied to an internal address bus IAdd between the data access address Add(O) and the refresh address Add(I).

Further, the control signal LCH is inputted to an internal address storing section 11 and an internal-address-redundancy-judgment-result storing section 12. When the refresh address Add(I) is supplied to the internal address bus IAdd, a storing operation to each of the storing sections 11, 12 is controlled. The internal address bus IAdd is connected to the internal address storing section 11, and the refresh address Add(I) controlled by the control signal LCH and supplied to the internal address bus IAdd is stored. A redundancy judgment result bus RJ from a redundancy judgment section 15 connected to the internal address bus IAdd is inputted to the internal-address-redundancy-judgment-result storing section 12, and a redundancy judgment result RJ(I) with respect to the refresh address Add(I) controlled by the control signal LCH and supplied to the internal address bus IAdd is stored.

The control signal SW is inputted to switching sections A(13) and J(14). The switching section A(13) selects the data access address Add(O) supplied to the internal address bus IAdd, or the refresh address Add(I) stored to the internal address storing section 11. The switching section J(14) selects a redundancy judgment result RJ(O) of the data access address Add(O) from the redundancy judgment section 15, or a storing redundancy judgment result LJ(I) stored to the internal-address-redundancy-judgment-result storing section 12. The selected address is outputted to an access-objective address bus MAdd. The selected result is outputted to an access-objective-redundancy-judgment-result bus MJ.

The access-objective address bus MAdd and the access-objective-redundancy-judgment-result bus MJ are connected to a word-line-driving-system circuit 64. In the word-line-driving-system circuit 64, decode processing, etc. are performed with respect to a word-objective address as an inputted access object and its redundancy judgment result (hereinafter both are collectively written as address information) so that the corresponding word lines WL0 to WLn (hereinafter generally written as WLs) are selected and activated. In this case, redundant word lines SWL0 to SWLm (hereinafter generally written as SWLs) are selected and activated instead of the word lines WL0 to WLn in accordance with the inputted redundancy judgment results RJ(O), RJ(I). The selected and activated word line WLs or redundant word line SWLs is inputted to a memory cell array 66, and memory cells as an object of access are selected.

In the semiconductor memory device of the first embodiment, the operations are mutually independently required in the data access operation mode required by the input of the control signal from the control terminals 50, and the refresh operation mode required from the built-in refresh timing timer section 56 every predetermined time. Therefore, the operation to be executed is determined by making the adjustment between the request signals REQ(O) and REQ(I) by the access arbiter 60. Concretely, the control signals inputted from the control terminals 50 are inputted to the I/O control section 54, and the request of external data access is outputted to the access arbiter 60 as the external-access request signal REQ(O). The refresh request signal REQ(I) is outputted from the refresh timing timer section 56, and the request of the refresh operation is outputted to the access arbiter 60.

In the access arbiter 60, when one of the external-access request signal REQ(O) and the refresh request signal REQ(I) is outputted, one of the data-access-mode signal M(O) and the refresh operation mode signal M(I) is outputted in accordance with the requested operation. When the operation requests concur, one of the operation mode signals M(O) and M(I) is preferentially outputted by adjusting the external-access request signal REQ(O) and the refresh request signal REQ(I). Thereafter, after the corresponding operation is terminated, one of the operation mode signals M(I) and M(O) as the other operation is subsequently outputted. It is also possible to precedently select one of control for precedently performing the refresh operation by preferentially performing the avoidance of disappearance of data, and control for precedently performing the external data access operation by preferentially making a response of the external access. A cycle time tCE is prescribed by both the continuous operations irrespective of the order of an operation sequence.

When the data-access-mode signal M(O) is outputted from the access arbiter 60, the address switching section 10 selects the data access address bus Add(O) by the control signal LCH outputted from the mode judgment section 62. The data access address Add(O) from the row address buffer 52 is fetched to the internal address bus IAdd. The internal address storing section 11 and the internal-address-redundancy-judgment-result storing section 12 are maintained in the storing state. The data access address Add(O) fetched to the internal address bus IAdd and the redundancy judgment result RJ(O) at the data access address Add(O) outputted by the redundancy judgment section 15 are not newly stored to these storing sections 11, 12.

The switching sections A(13) and J(14) select the internal address bus IAdd and the redundancy judgment result bus RJ by the control signal SW outputted from the mode judgment section 62. The data access address Add(O) is fetched to an access-objective address bus MAdd, and the redundancy judgment result RJ(O) is fetched to the access-objective-redundancy-judgment-result bus MJ.

The address signals inputted from the address terminals 50 are selected by the address switching section 10 as the data access address Add(O) through the row address buffer 52, and are fetched to the internal address bus IAdd. This address signals are further selected by the switching section A(13) and are fetched to the access-objective address bus MAdd. The data access address Add(O) fetched to the internal address bus IAdd is simultaneously judged in redundancy in the redundancy judgment section 15. The redundancy judgment result RJ(O) is selected by the switching section J(14) and is fetched to the access-objective-redundancy-judgment-result bus MJ.

The mode judgment section 62 switches the control signals LCH, SW every switching of the operation mode signals M(O), M(I). Accordingly, when the data-access-mode signal M(O) is once inputted, the control signals LCH, SW are maintained in the above state until the refresh operation mode signal M(I) is inputted. An address path for propagating the data access address Add(O) is established in each of the address buses IAdd, MAdd.

When the refresh operation mode signal M(I) is outputted from the access arbiter 60, the address switching section 10 selects the refresh address bus Add(I) by the control signal LCH outputted from the mode judgment section 62, and the refresh address Add(I) from the refresh address counter 53 is fetched to the internal address bus IAdd. Further, the internal address storing section 11 and the internal-address-redundancy-judgment-result storing section 12 attain the storing state of address information. The refresh address Add(I) fetched to the internal address bus IAdd and the redundancy judgment result RJ(I) at the refresh address Add(I) outputted by the redundancy judgment section 15 are stored to these storing sections 11, 12.

The switching sections A(13) and J(14) select a stored address bus LAdd and a stored-redundancy-judgment-result bus LJ from the internal address storing section 11 and the internal-address-redundancy-judgment-result storing section 12 by the control signal SW outputted from the mode judgment section 62. The refresh address Add(I) stored to the internal address storing section 11 is fetched to the access-objective address bus MAdd. The redundancy judgment result RJ(I) at the refresh address Add(I) stored to the internal-address-redundancy-judgment-result storing section 12 is fetched to the access-objective-redundancy-judgment-result bus MJ.

Here, the refresh address Add(I) stored to the internal address storing section 11 and the redundancy judgment result RJ(I) stored to the internal-address-redundancy-judgment-result storing section 12 are immediately fetched to the access-objective address bus MAdd and the access-objective-redundancy-judgment-result bus MJ when the refresh operation is started. After the fetch operation is completed, it is necessary to complete the storage to the internal address storing section 11 and the internal-address-redundancy-judgment-result storing section 12 until the next refresh operation is performed.

When the adjustment to the refresh request signal REQ(I) is made and the refresh operation mode signal M(I) is outputted by the access arbiter 60, the control signal SW is precedently outputted from the mode judgment section 62, and the stored address bus LAdd and the stored-redundancy-judgment-result bus LJ are selected by the switching sections A(13) and J(14), and the refresh operation is started. The refresh address Add(I) and its redundancy judgment result RJ(I) are fetched from each of the storing sections 11, 12 to the word-line-driving-system circuit 64 as address information being an object of the refresh operation.

After the address information stored to each of the storing sections 11, 12 is outputted, it is necessary to update the stored contents. Namely, it is necessary to update these contents to the address information as an object of the next refresh operation. This update is performed by the control signal LCH from the mode judgment section 62. The timing of this update can be set to any timing before the next operation mode is started. This timing may be set during an operation period for performing the present refresh operation, and may be also set during a pre-charge period after the present refresh operation is completed. If this timing is set during the period until the next operation mode is started, the next operation mode signals M(O), M(I) are not outputted from the access arbiter 60. When the next operation mode shows the refresh operation, no un-updated address information is fetched from each of the storing sections 11, 12 to the word-line-driving-system circuit 64. When the next operation mode is the data access operation mode, there is no case in which no refresh address Add(I) to be updated from the refresh address counter 53 can be supplied by selecting the data access address bus Add(O) by the address switching section 10.

The refresh address Add(I) and the redundancy judgment result RJ(I) updated in the respective storing sections 11, 12 are continuously stored in the respective storing sections 11, 12 irrespective of the operating state until the next refresh operation.

It is possible to set a construction in which the control signal LCH is outputted and the refresh address Add(I) and its redundancy judgment result RJ(I) are fetched to the respective storing sections 11, 12 in a period for outputting no operation mode signals M(O), M(I) by outputting the control signal from the refresh timing timer section 56 in predetermined timing preceding the refresh request signal REQ(I) although this construction is not illustrated in the drawings.

Here, the count value of the refresh address counter 53 should be updated before the refresh address bus Add(I) is selected by the control signal LCH.

The refresh address Add(I) from the refresh address counter 53 is updated in parallel with the refresh operation. The updated refresh address Add(I) is selected by the control signal LCH in the address switching section 10 before the next refresh operation corresponding to this Add(I) is started. The updated refresh address Add(I) is fetched to the internal address bus IAdd, and is stored to the internal address storing section 11. Simultaneously, the redundancy judgment is made by the redundancy judgment section 15, and the redundancy judgment result RJ(I) is stored to the internal-address-redundancy-judgment-result storing section 12. These address information is stored until the corresponding refresh operation is started.

When the corresponding refresh operation is started, the refresh address Add(I) and the redundancy judgment result RJ(I) stored to the respective storing sections 11, 12 are selected by the control signal SW by the switching sections A(13) and J(14), and are fetched to the access-objective address bus MAdd and the access-objective-redundancy-judgment-result bus MJ. The refresh address Add(I) and the redundancy judgment result RJ(I) are then outputted to the memory cell array 66 as the word line WLs or the redundant word line SWLs after decode processing, etc. in the word-line-driving-system circuit 64.

In the mode judgment section 62, the control signals LCH, SW are switched every switching of the operation mode signals M(O), M(I). Accordingly, when the refresh operation mode signal M(I) is once inputted, the control signals LCH, SW are maintained in the above state until the data-access-mode signal M(O) is inputted. The refresh address Add(I) is propagated to the internal address bus IAdd. Further, the stored address bus LAdd and the stored-redundancy-judgment-result bus LJ are selected in the access-objective address bus MAdd and the access-objective-redundancy-judgment-result bus MJ. Therefore, the refresh address Add(I) and the redundancy judgment result RJ(I) stored in advance can be supplied to the word-line-driving-system circuit 64 so that the supply time of the address information can be shortened.

Figure 2:
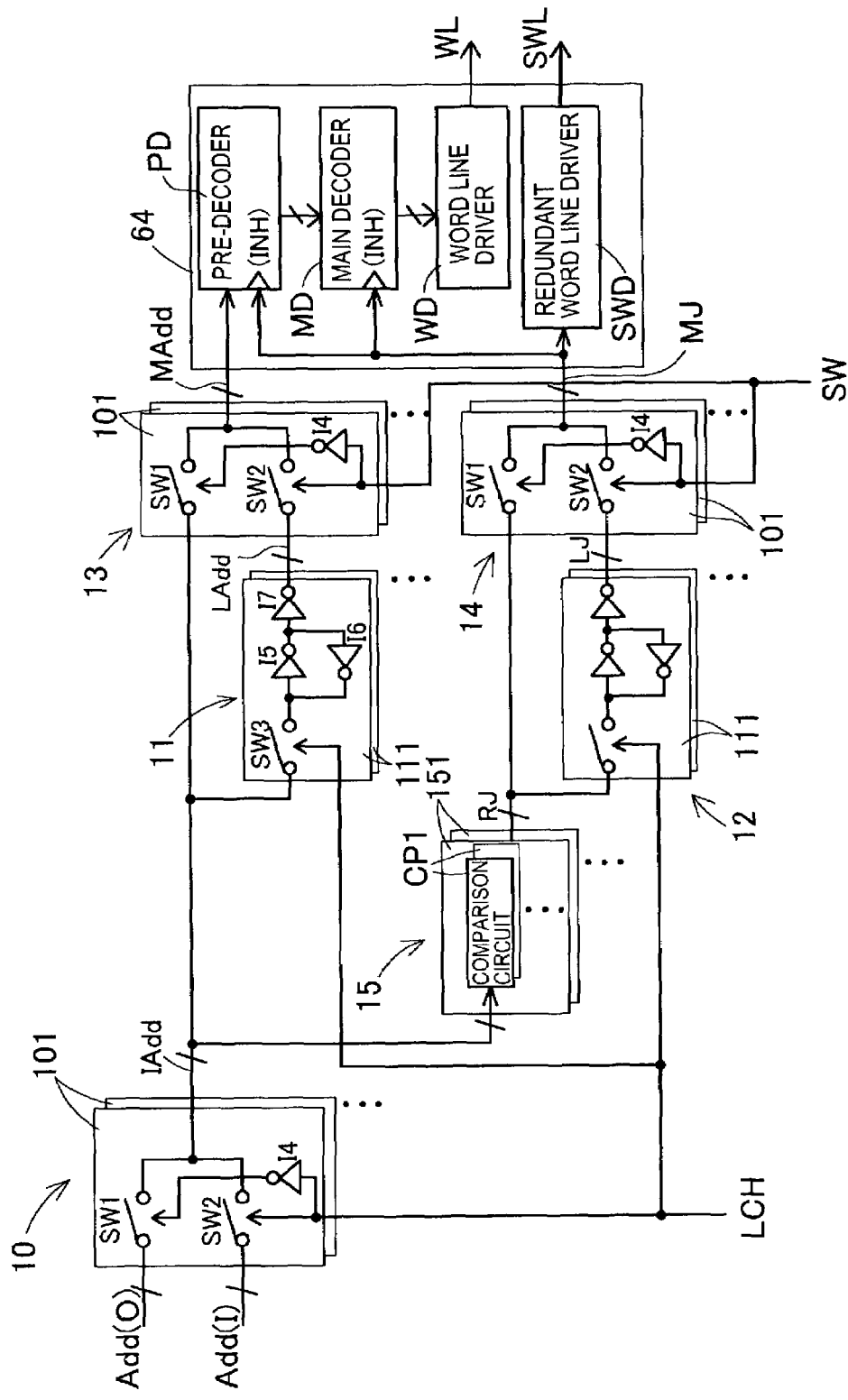
FIG. 2 is a circuit block diagram a specific example directed to the First Embodiment.

FIG. 2 shows a concrete example with respect to the circuit construction at the subsequent stage from the address switching section 10 in the first embodiment. The address switching section 10 is constructed by arranging a switching circuit 101 every address bit. Each switching circuit 101 is constructed by switch sections SW1, SW2 and an inverter gate I4 for logically inverting the control signal LCH. Each of the switch sections SW1, SW2 switches each address bit information of the data access address Add(O) and each address bit information of the refresh address Add(I).

The redundancy judgment section 15 is constructed by arranging a redundancy judgment circuit 151 every address information set as the data access address Add(O) or the refresh address Add(I). In each redundancy judgment circuit 151, a comparison circuit CP1 is arranged every address bit information with respect to the address information set as the data access address Add(O) or the refresh address Add(I). The comparison circuit CP1 compares each address bit information and each address bit information of unillustrated redundant address information every bit. The redundancy judgment result RJ(O) or RJ(I) is outputted to the redundancy judgment result bus RJ as a judgment result as to whether the data access address Add(O) or the refresh address Add(I) is conformed to the redundant address or not. The redundancy construction is selected by the redundancy judgment result RJ(O) or RJ(I) outputted when the address information is conformed. The redundancy judgment circuit 151 is arranged every redundant address in accordance with the number of redundancy constructions able to be replaced.

The internal address storing section 11 is constructed by arranging a storing circuit 111 every address bit. Each storing circuit 111 has a switch section SW3 for fetching each address bit information of the refresh address Add(I) on the internal address bus IAdd, and a latch section for latching the address bit information at the fetched refresh address Add(I). The latch section is constructed by mutually connecting the input and output terminals of inverter gates I5, I6. An inverter gate I7 is connected to the output terminal of the latch section, and an output terminal of the inverter gate I7 constitutes the stored address bus LAdd.

The internal-address-redundancy-judgment-result storing section 12 is constructed by arranging a storing circuit 111 every redundancy judgment result bus RJ, and its output terminal constitutes the stored-redundancy-judgment-result bus LJ.

Similar to the address switching section 10, the switching section A(13) is constructed by arranging a switching circuit 101 every address bit. Each address bit information at the data access address Add(O) propagated to the internal address bus IAdd, and each address bit information at the refresh address Add(I) stored to the storing circuit 111 in advance and outputted to the stored address bus LAdd are respectively inputted to switch sections SW1 and SW2 of each switching circuit 101. These address bit information is switched by the control signal SW, and is outputted to the access-objective address bus MAdd.

The switching section J(14) has a construction similar to that of the switching section A(13). The redundancy judgment result RJ(O) at the data access address Add(O) outputted to the redundancy judgment result bus RJ and the redundancy judgment result RJ(I) at the refresh address Add(I) stored to the storing circuit 111 in advance and outputted to the stored-redundancy-judgment-result bus LJ are switched by the control signal SW and are outputted to the access-objective-redundancy-judgment-result bus MJ every switching circuit 101.

In the word-line-driving-system circuit 64, the access-objective address bus MAdd is connected to a pre-decoder PD, and the pre-decoder PD is connected to a main decoder MD. The address information propagated to the access-objective address bus MAdd is decoded. With respect to the decoded address information, a predetermined word line WL is selected and activated via a word line driver WD. The access-objective-redundancy-judgment-result bus MJ is connected to a redundant word line driver SWD, and is also connected to inhibition (INH) terminals of the pre-decoder PD and the main decoder MD. When the redundancy judgment result RJ(O) or RJ(I) propagated to the access-objective-redundancy-judgment-result bus MJ shows conformity with the redundant address, the pre-decoder PD and the main decoder MD are set to be non-active, and a predetermined redundant word line SWL is selected and activated from the redundant word line driver SWD.

In the concrete example of FIG. 2, each of the address switching section 10, the switching section A(13) and the switching section J(14) is constructed by the switching circuit 101. A signal path is established by statically turning-on one of the switch sections SW1, SW2 by the logic levels of the control signals LCH, SW. The established signal path is maintained until re-switching using the switch sections SW1, SW2 is performed.

The control signals LCH, SW can set to control for switching the address path by inverting the logic levels in switching timings of the mode signals M(O), M(I). When high speed responsibility with respect to the external data access operation is secured, it is possible to set a construction in which the address path with respect to the data access address bus Add(O) is established in advance as a standard address path, and switching to the refresh address bus Add(I) is performed at a generating time of the refresh operation mode signal M(I) with respect to the refresh request signal REQ(I) every predetermined timing. The refresh address Add(I) propagated in this case is address information with respect to the refresh operation at the next time, and is propagated to be stored to each of the storing sections 11, 12 in advance. The address information as a refresh object is taken out of each of the storing sections 11, 12 into which the address information is stored in advance. Therefore, the propagation delay of the address information has no influence on the response speed of the refresh operation even in the switching construction to the refresh address bus Add(I) at the generating time of the refresh operation mode signal M(I).

Figure 3:
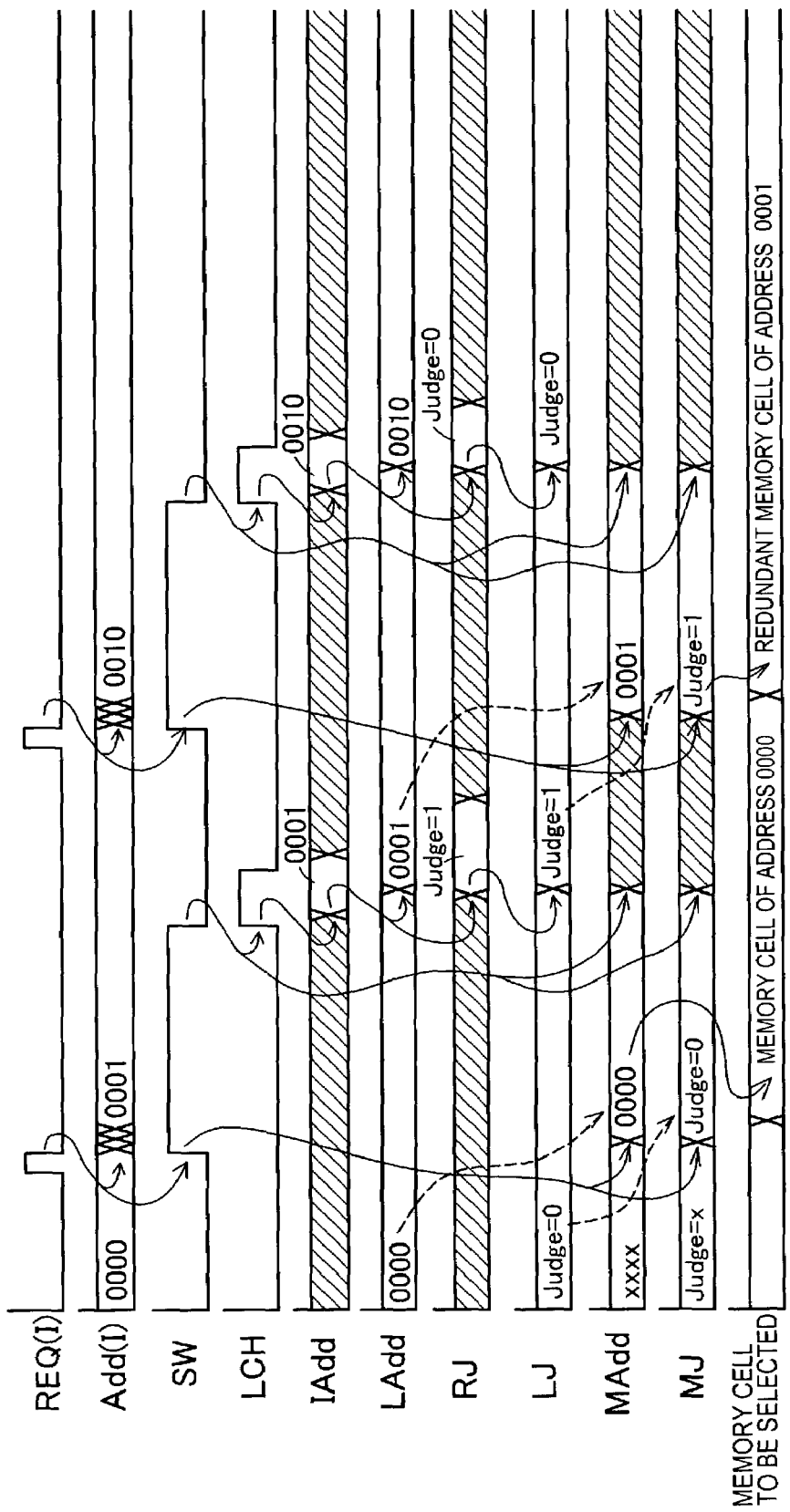
FIG. 3 is an operational waveform diagram of the First Embodiment.

FIG. 3 shows operational waveforms when the refresh operation mode signal M(I) is continued with respect to the operation of the semiconductor memory device in the first embodiment. When the refresh request signal REQ(I) is outputted from the refresh timing timer section 56, the refresh address Add(I) is counted up to (0001) from (0000) in the refresh address counter 53. Here, difference of the address transition in time shows that the count-up operation in the counter 53 is sequentially advanced every bit. If the counter of a synchronization type is used, the time difference of the address transition can be compressed.

The outputted refresh request signal REQ(I) is propagated to the mode judgment section 62 as the refresh operation mode signal M(I) via the access arbiter 60, and the control signal SW at the high level is outputted. Here, it shows a case in that the control signal SW is maintained at the high level during the operation period of the refresh operation, and the stored address bus LAdd and the stored-redundancy-judgment-result bus LJ are continuously connected to the access-objective address bus MAdd and the access-objective-redundancy-judgment-result bus MJ. The refresh address (0000) and the redundancy judgment result (Judge=0) of nonconformity stored to the respective storing sections 11, 12 at the previous refresh operation mode time are outputted to the stored address bus LAdd and the stored-redundancy-judgment-result bus LJ. Accordingly, the address (0000) and the nonconformity judgment (Judge=0) are outputted to the access-objective address bus MAdd and the access-objective-redundancy-judgment-result bus MJ in accordance with the high level transition of the control signal SW. The memory cell at the address (0000) is selected by these address information.

In the meantime, the logic level of the control signal LCH is maintained at the low level. Therefore, the internal address bus IAdd is connected to the data access address bus Add(O) by the switch section SW1 of the address switching section 10. The internal address bus IAdd is set to indefinite address information outputted through the row address buffer 52. An indefinite judgment result with respect to this indefinite address information is set to the redundancy judgment result bus RJ.

When the operation period of the refresh operation is terminated and is transferred to the pre-charge period and the control signal SW is changed to the low level, a high level pulse is outputted for a predetermined time by the control signal LCH. In the meantime, the internal address bus IAdd is connected to the refresh address bus Add(I) by the switch section SW2 of the address switching section 10. The refresh address (0001) already counted up at an output time point of the refresh request signal REQ(I) is set to the internal address bus IAdd. A conformity judgment (Judge=1) is outputted to the redundancy judgment result bus RJ as the redundancy judgment result RJ(I) at the address (0001). Further, the switch section SW3 of each of the storing sections 11, 12 is also turned on by the control signal LCH at the high level. Accordingly, the address (0001) and the conformity judgment (Judge=1) are stored.

The switch section SW1 of the address switching section 10 is turned on by terminating the high level pulse period of the control signal LCH, and the internal address bus IAdd is again connected to the data access address bus Add(O) Indefinite information is set to the internal address bus IAdd and the redundancy judgment result bus RJ. However, since the switch section SW3 of each of the storing sections 11, 12 is turned off, no indefinite information is stored and the address (0001) and the redundancy judgment result (Judge=1) as objects of the next refresh operation are stored.

The similar operation is repeated with respect to the subsequent refresh request signal REQ(I). In the circuit operation of FIG. 3, the refresh address counter 53 is counted up in accordance with the refresh request signal REQ(I), and the address information as the object of the next refresh operation is set in advance. The address information set by the refresh address counter 53 is stored to the internal address storing section 11 in the pre-charge period after the operation period of the refresh operation is terminated. Further, the redundancy judgment result RJ(I) provided by the redundancy judgment section 15 is stored to the internal-address-redundancy-judgment-result storing section 12.

Figure 4:
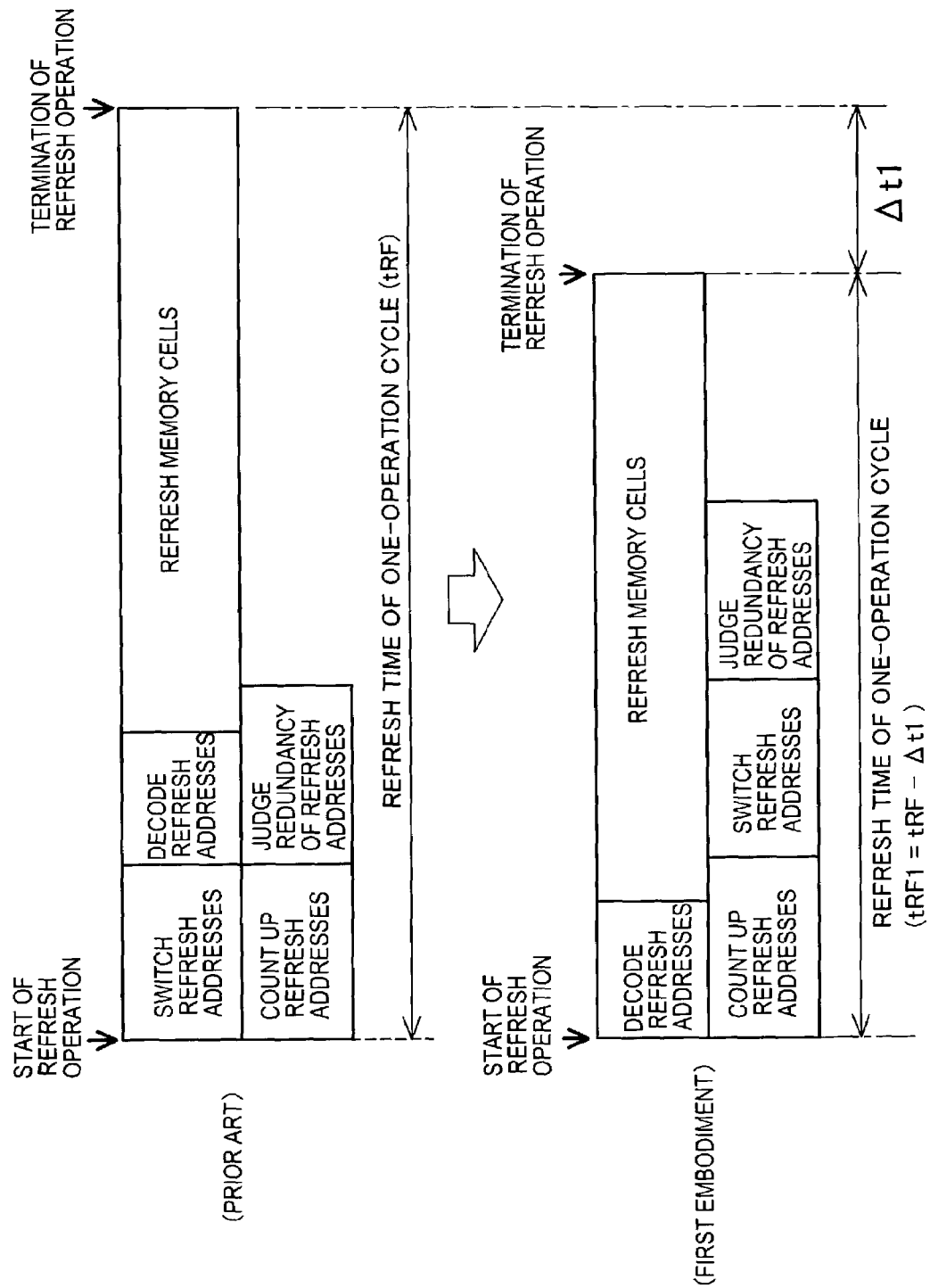
FIG. 4 shows refresh operation time shortened effect according to the First Embodiment.

FIG. 4 shows the details of a refresh operation time tRF1 of one-operation cycle in the first embodiment in comparison with the refresh operation time tRF of the prior art. In the prior art, the count-up operation of the refresh address and the redundancy judgment operation with respect to the refresh address are performed in parallel with the refresh operation preceding the refresh operation as the object. These preceding operations are buried into the operation periods of the switching operation to the refresh address in the refresh operation period, the decoding operation of the refresh address, and the refresh executing operation of the memory cell.

In the first embodiment, the switching operation to the refresh address can be also performed in parallel with the refresh operation preceding the refresh operation as the object in addition to the preceding operation in the prior art. Thus, a time Δt1 required in the switching operation of the address can be shortened. The refresh operation time tRF1 becomes tRF1=tRF−Δt1.

Here, the switching operation to the refresh address shows that the connection to the internal address bus IAdd is switched from the data access address bus Add(O) to the refresh address bus Add(I). It is considered that there is a case in which the load capacity of the internal address bus IAdd is large. There is also a case in which a large time is required with respect to the switching time Δt1 until the refresh address Add(I) is set to the internal address bus IAdd. The load capacity of the internal address bus IAdd includes parasitic capacity due to bus wiring, input capacities of each of the storing sections 11, 12, each of the switching sections 13, 14, the redundancy judgment section 15, etc. It is necessary to arrange the redundancy judgment section 15 in accordance with the redundancy construction every redundant address able to perform the replacement with the redundancy construction. When many redundancy constructions are arranged, it is necessary to arrange many redundancy judgment sections 15 so that the load capacity of the internal address bus IAdd is increased.

Figure 5:
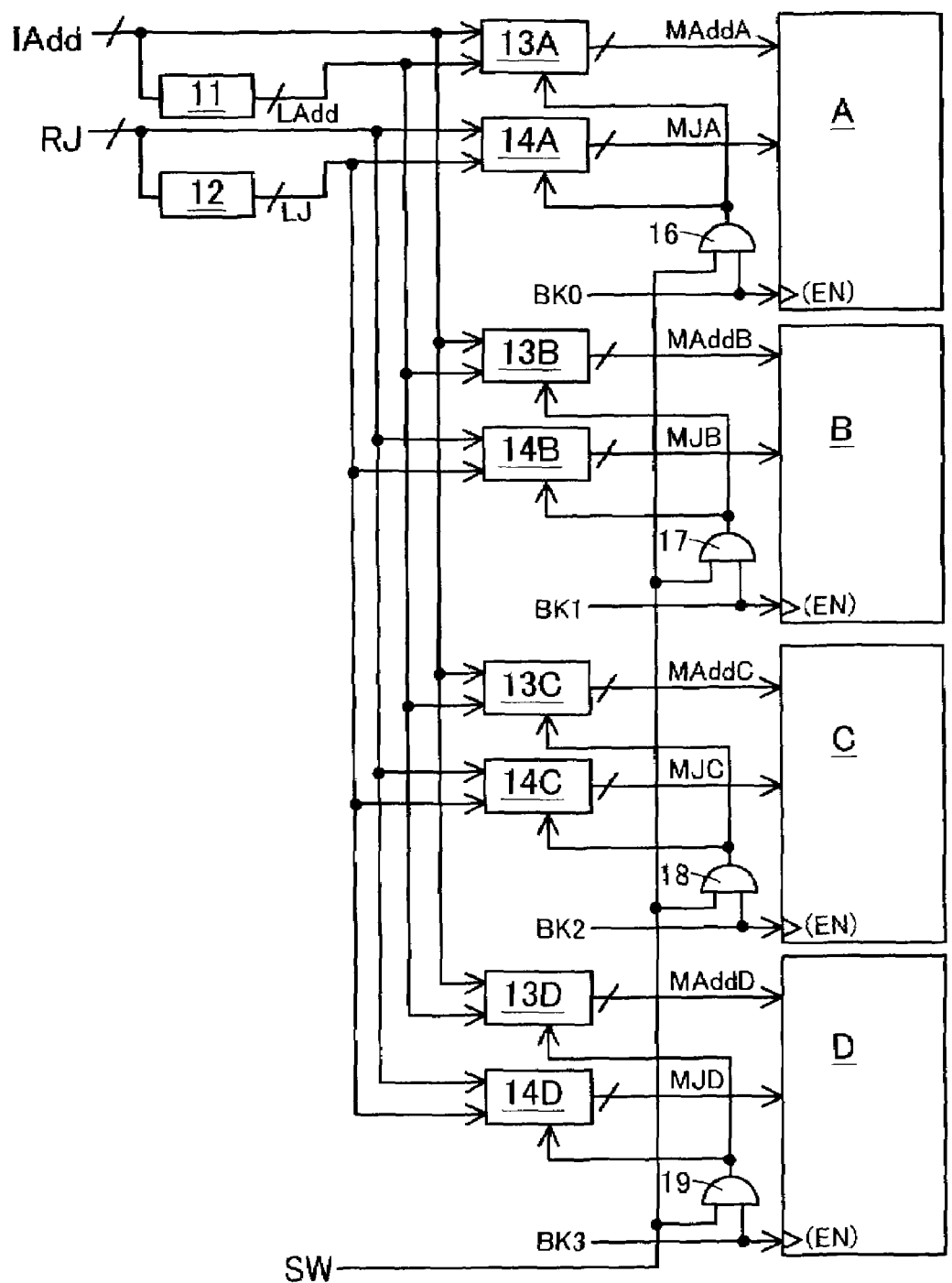
FIG. 5 is a circuit block diagram of a modification directed to the First Embodiment.

FIG. 5 shows a modified example of the first embodiment. A word-line-driving-system circuit 64 and a memory cell array 66 are divided into banks A to D, and are activated and controlled by bank control signals BK0 to BK3 every bank A to D. A switching section A (13A to 13D) and a switching section J (14A to 14D) are arranged every bank A to D, and a logic product calculation is made by NAND gates 16 to 19 between a control signal SW and bank control signals BK0 to BK3. Thus, activation is performed and a selection destination is switched every bank A to D. It is sufficient to control the activation with respect to only the bank requiring the refresh operation so that consumed electric current can be reduced.

Figure 6:
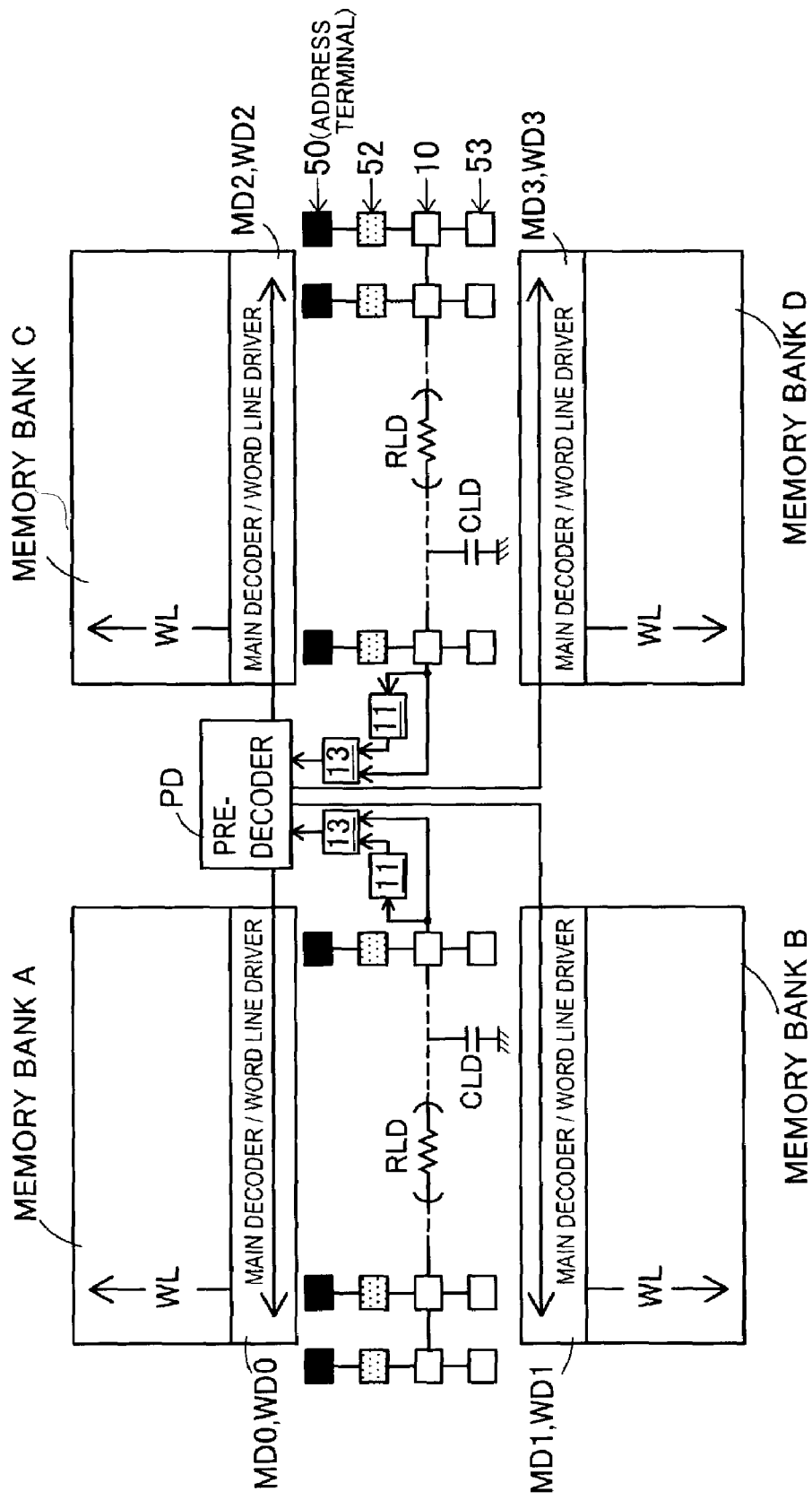
FIG. 6 shows a layout example of the First Embodiment.

FIG. 6 shows a layout arrangement example when the semiconductor memory device of the first embodiment is divided into four memory banks A to D. In the semiconductor memory device of FIG. 6, an address terminals 50 and a row address buffer 52 are arranged in the entire chip along the chip long side direction near the center of a short side of the chip from the restriction of an interface with the exterior at a mounting, etc. A refresh address counter 53 is also dispersed and arranged in conformity with this arrangement of the address terminals 50 and the row address buffer 52. Further, an address switching section 10 is also dispersed and arranged between the row address buffer 52 and the refresh address counter 53.

In the arrangement of FIG. 6, each of the storing sections 11, 12 or each of the switching sections 13, 14 is arranged in one of positions in the chip long side direction in which the address switching section 10 is dispersed and arranged. The length in the chip long side direction is long, and parasitic resistance RLD and parasitic capacity CLD are increased in the case of long distance wiring. Further, the pre-decoder PD for inputting the address information is constructed by a logic gate of many inputs in accordance with the address bit width, and has large input capacity. Accordingly, it is necessary to devise the circuit arrangement such that no high speed responsibility is limited by increasing a signal propagation delay by these loads.

Therefore, in FIG. 6, each of the storing sections 11, 12, each of the switching sections 13, 14 and the pre-decoder PD are connected at short wiring distances in comparison with the wiring distances from the address switching section 10 to each of the storing sections 11, 12 and each of the switching sections 13, 14 by arranging each of the storing sections 11, 12 and each of the switching sections 13, 14 on the pre-decoder PD side. Thus, the wiring loads between each of the storing sections 11, 12, each of the switching sections 13, 14 and the pre-decoder PD are reduced and the propagation delay time of the address information is reduced. At this time, there is a case in which the wiring load is arranged between the address switching section 10 and each of the storing sections 11, 12. However, if the storing operation of the address information to each of the storing sections 11, 12 is sufficiently precedently performed, no refresh operation time is increased. The time until the establishment of the address information can be shortened so that the operation time can be further shortened.

As explained above in detail, in accordance with the semiconductor memory device and its control method in the first embodiment, the refresh address Add(I) as an access object can be established prior to the next refresh operation mode as the next second operation mode with respect to the refresh address Add(I) as a second address sequentially assigned by the refresh address counter 53 in a predetermined order determined in advance. Accordingly, it is possible to previously store the refresh address Add(I) in the next refresh operation mode, and the redundancy judgment result RJ(I) in which the redundancy judgment is made with respect to this refresh address Add(I). When the refresh operation mode is started, it is not necessary to perform the establishing operation of the refresh address Add(I), the redundancy judgment operation of the refresh address Add (I), and the establishing operation of the redundancy judgment operation. Accordingly, the operation period of the refresh operation mode can be shortened.

Further, the cycle time can be shortened in an operation specification in which the data access operation mode as the first operation mode and the refresh operation mode are set to a pair of access operations. When the refresh operation mode is set to be prior, the access time in the data access operation mode can be shortened. Further, when the refresh operation mode is performed in accordance with necessity between plural data access operation modes, occupancy ratio of the data access operation modes can be improved.

Further, the storage to the internal address storing section 11 and the internal-address-redundancy-judgment-result storing section 12 is performed by one storing operation using a high level pulse signal as one shot driving of the control signal LCH. Therefore, the possibility that this storage is badly influenced by a voltage change, etc. is small. If one shot driving is performed in timing having a small voltage change as in the pre-charge period, etc. after the termination of the refresh operation period, the possibility that the storage is badly influenced by the voltage change is further reduced. Accordingly, the storing operation can be reliably performed.

Further, if the word-line-driving-system circuit 64 and the memory cell array 66 are divided into banks A to D and the switching section A (13A to 13D) and the switching section J (14A to 14D) are arranged every bank and activation is controlled by bank control signals BK0 to BK3, it is possible to perform the refresh operation with respect to only the bank requiring the refresh operation so that the consumed electric current can be reduced.

Further, if each of the storing sections 11, 12 and each of the switching sections 13, 14 are arranged on the pre-decoder PD side so as to shorten the wiring distance therebetween, the wiring load is reduced so that the propagation delay time of the address information can be reduced. The time until the establishment of the address information can be shortened so that the operation time can be further shortened.

Figure 7:
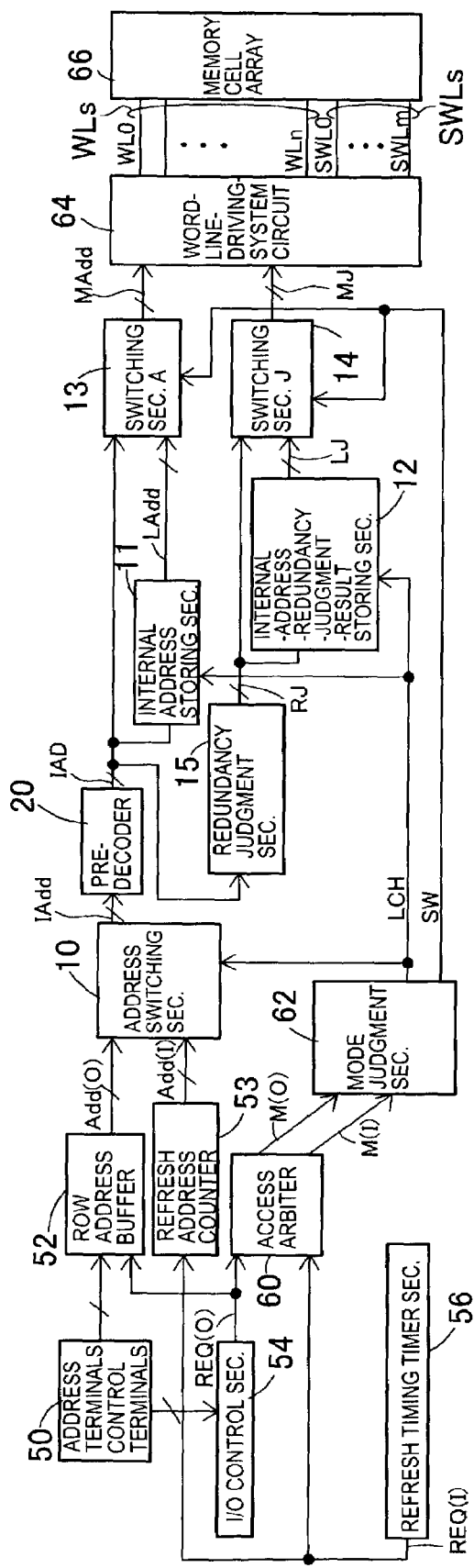
FIG. 7 is a circuit block diagram of a first specific example directed to a Second Embodiment.

In a first concrete example of a second embodiment shown in FIG. 7, a pre-decoder 20 is arranged at the latter stage of the address switching section 10 instead of the pre-decoder PD arranged within the word-line-driving-system circuit 64 in the first embodiment (FIG. 1). An internal pre-decoded address bus IAD connected to the output of the pre-decoder 20 is connected to the redundancy judgment section 15, each of the storing sections 11, 12 and each of the switching sections 13, 14.

Figure 8:
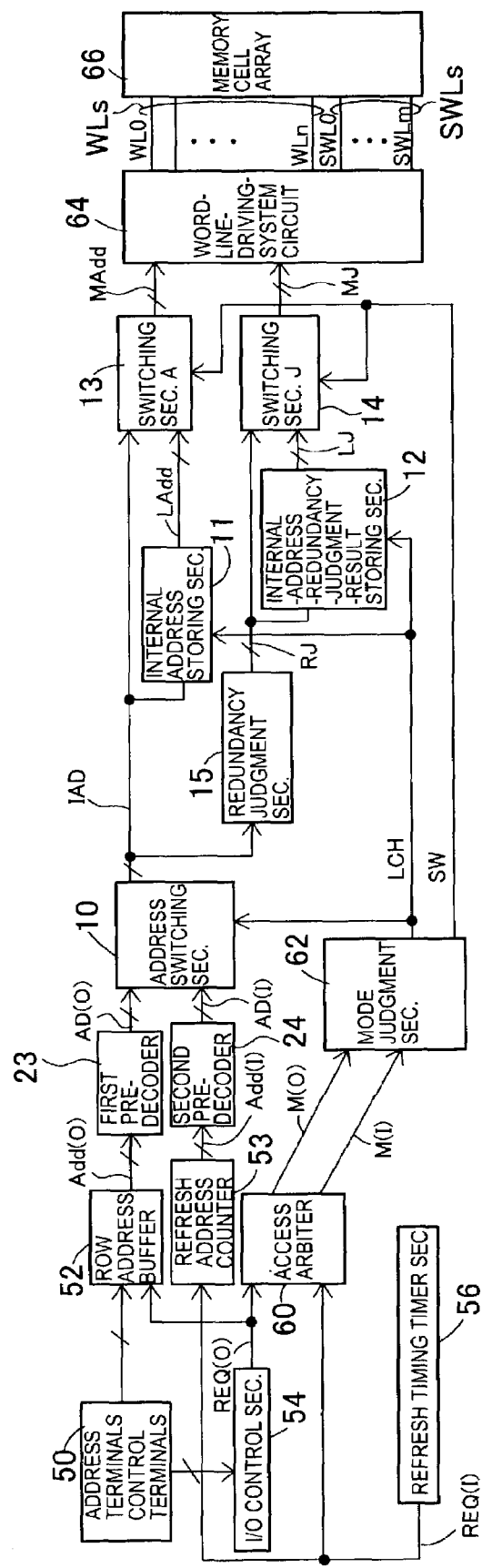
FIG. 8 is a circuit block diagram of a second specific example directed to the Second Embodiment.

In a second concrete example of the second embodiment shown in FIG. 8, first and second dedicated pre-decoders 23, 24 are arranged with respect to the data access address Add(O) and the refresh address Add(I) at the latter stages of the row address buffer 52 and the refresh address counter 53 instead of the pre-decoder PD of the first embodiment (FIG. 1). External and internal pre-decode addresses AD(O), AD(I) outputted from the first and second pre-decoders 23, 24 are selected by the address switching section 10.

FIG. 9 shows the details of a refresh operation time tRF2 of one-operation cycle in the second embodiment in comparison with the refresh operation times tRF and tRF1 in the prior art and the first embodiment. In the second embodiment, the pre-decode operation of the refresh address can be also performed in parallel at the refresh operation time preceding the refresh operation as an object in addition to the preceding operation in the first embodiment. Thus, a time $\Delta t2$ required in the pre-decode operation can be further shortened. The refresh operation time tRF2 becomes tRF2=tRF−$\Delta t1$−$\Delta t2$.

Figure 10:
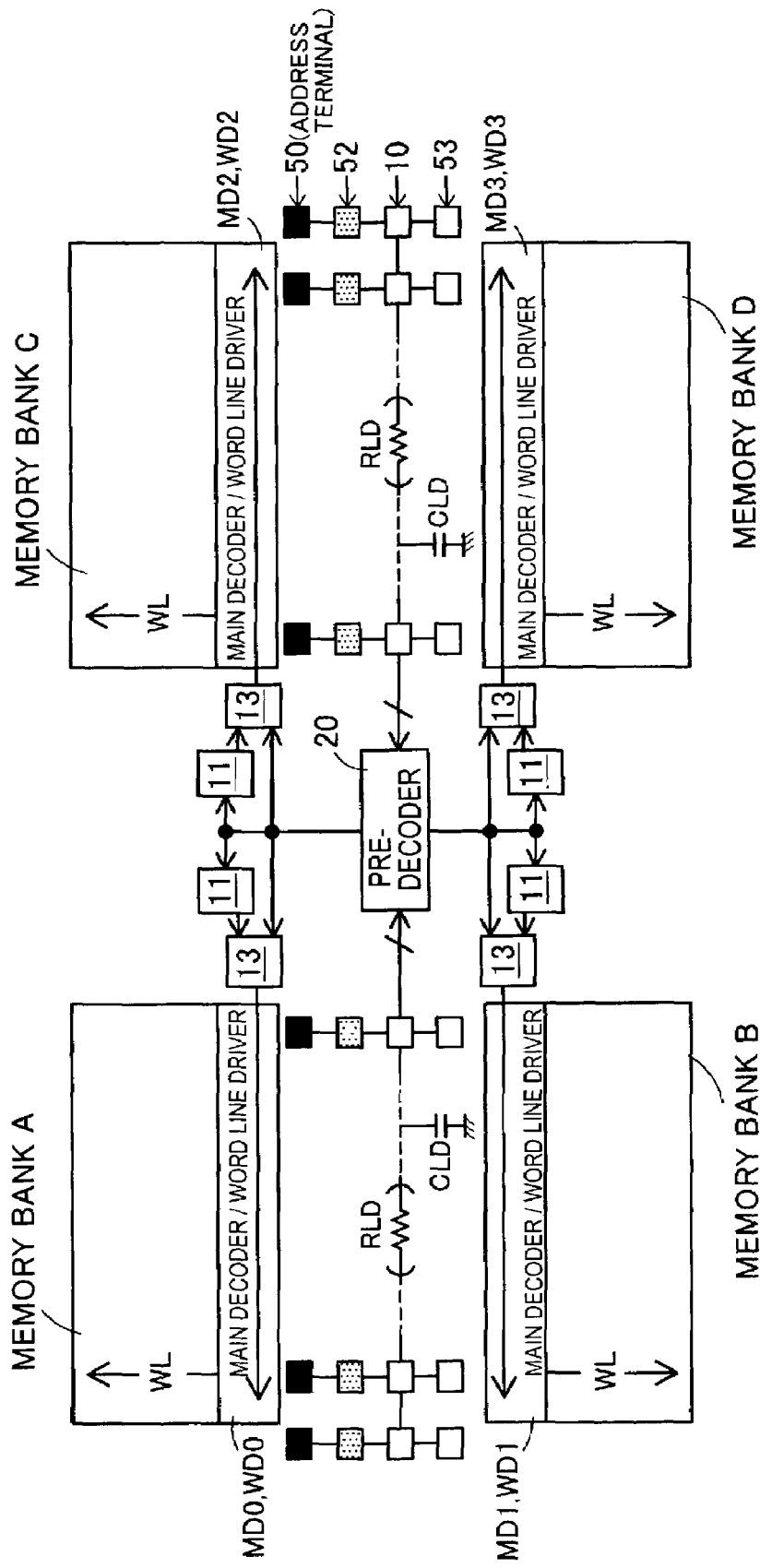
FIG. 10 shows a layout example of the Second Embodiment.

Similar to the case shown in FIG. 6, FIG. 10 shows a layout arrangement example when the semiconductor memory device of the first concrete example of the second embodiment is divided into four memory banks A to D. Main decoders MD0 to MD3 of the word-line-driving-system circuit 64 and word line drivers WD0 to WD3 are arranged in proximity to the memory cell array in each of the banks A to D. The row address buffer 52, the refresh address counter 53 and the address switching section 10 are arranged in the entire chip along the chip long side direction near the center of a short side of the chip. Therefore, in the case of long distance wiring, parasitic resistance RLD and parasitic capacity CLD are increased. Further, each of the main decoders MD0 to MD3 for inputting address information thereto from the pre-decoder 20 is constructed by a logic gate of many inputs in accordance with the address bit width, and has large input capacity. Accordingly, it is necessary to devise the circuit arrangement such that no high speed responsibility is limited by increasing the signal propagation delay by these loads.

Therefore, in FIG. 10, the pre-decoder 20 arranged at the latter stage of the address switching section 10 is arranged on the sides of each of the storing sections 11, 12 and each of the switching sections 13, 14 so as to make the connection at a short wiring distance in comparison with the wiring distance from the address switching section 10 to the pre-decoder 20. Thus, the propagation delay time of the address information is reduced by reducing the wiring loads between the pre-decoder 20, each of the storing sections 11, 12 and each of the switching sections 13, 14. At this time, there is a case in which the wiring load is arranged between the address switching section 10 and the pre-decoder 20. However, no refresh operation time is increased by sufficiently precedently performing the storing operation of the address information to each of the storing sections 11, 12. The time until the establishment of the address information can be shortened, and the operation time can be further shortened.

In FIG. 10, the first concrete example of the second embodiment is illustrated. However, in the second concrete example, similar effects can be also obtained if the first and second pre-decoders 23, 24 and the address switching section 10 are arranged in the arranging position of the pre-decoder 20 of FIG. 10, and the wiring distances of the pre-decoders 23, 24 and the address switching section 10 are shortened.

As explained above in detail, in accordance with the semiconductor memory device and its control method in the second embodiment, the pre-decode processing of the refresh address Add(I) as a second address can be also performed in advance prior to the refresh operation mode as the second operation mode. Accordingly, the operation period of the refresh operation mode can be further shortened.

Further, the propagation delay time of the address information can be reduced if the wiring load is reduced by shortening the wiring distances between the pre-decoder 20, each of the storing sections 11, 12 and each of the switching sections 13, 14, or the wiring distances between the pre-decoders 23, 24 and the address switching section 10. The operation time can be further shortened.

Figure 11:
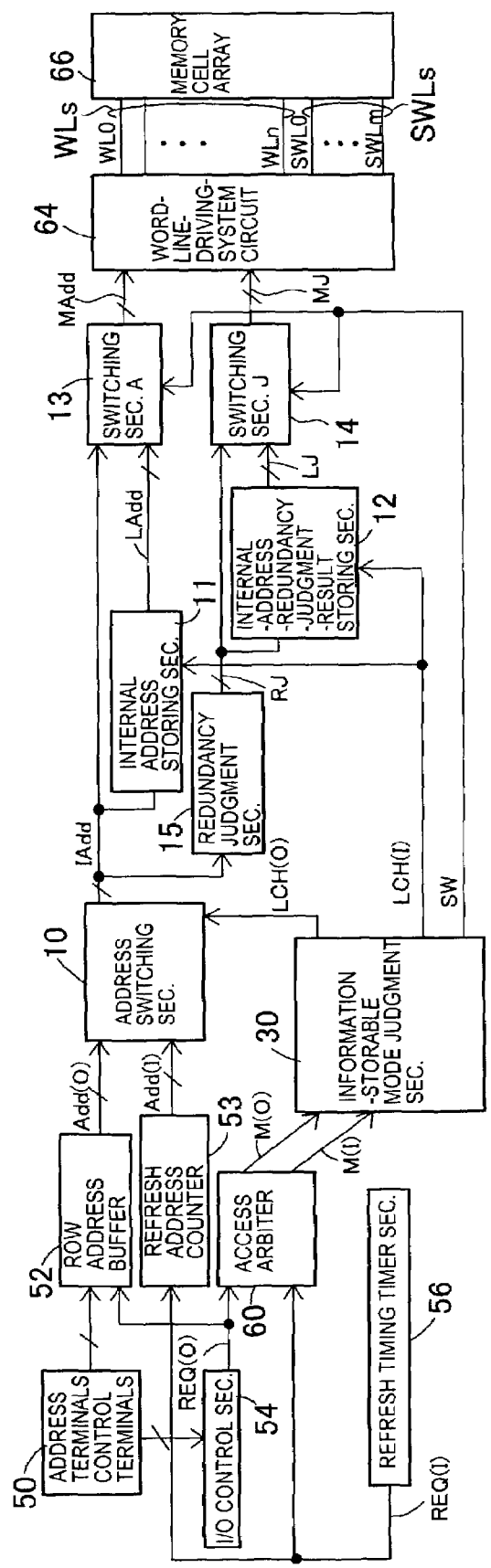
FIG. 11 is a circuit block diagram of a Third Embodiment.

In a third embodiment shown in FIG. 11, an information-storable mode judgment section 30 is arranged instead of the mode judgment section 62 in the first embodiment (FIG. 1). Control signals LCH(O), LCH(I) and SW are outputted from the information-storable mode judgment section 30. The data access address bus Add(O) and the refresh address bus Add(I) in the address switching section 10, and each of the switching sections 13, 14 are respectively selected by the control signals.

The data-access-mode signal M(O) and the refresh operation mode signal M(I) are inputted to the information-storable mode judgment section 30. It is possible to set a construction for switching the selecting state of a bus of the address switching section 10 or each of the switching sections 13, 14 by controlling at least one of the control signals LCH(O), LCH(I) and the control signal SW only when these mode signals M(O), M(I) are switched by an adjustment using the access arbiter 60. The switched selecting state is maintained until the mode signals M(O), M(I) are further switched. If this control is applied with respect to the control signal LCH(I), the storable state of the address information is continuously maintained in each of the storing portions 11, 12 when the refresh address bus Add(I) is in the selecting state by the address switching section 10. This state is continued until the control signal LCH(O) is outputted. The address information stored at the time point of the output of the control signal LCH(O) is stored until the next refresh operation mode.

Further, it is possible to set a construction such that at least either control signals LCH(O), LCH(I) or a control signal are/is pulse signal(s) and controlled and outputted along with every mode signals M(O), M(I). In this case, the selection of the bus of the address switching section 10 or each of the switching sections 13, 14 is made by pulse driving. If a construction for storing the address information fetched by the pulse driving by a latch circuit, etc. is set, it is possible to precisely fetch the address information required every mode signals M(O), M(I).

Figure 12:
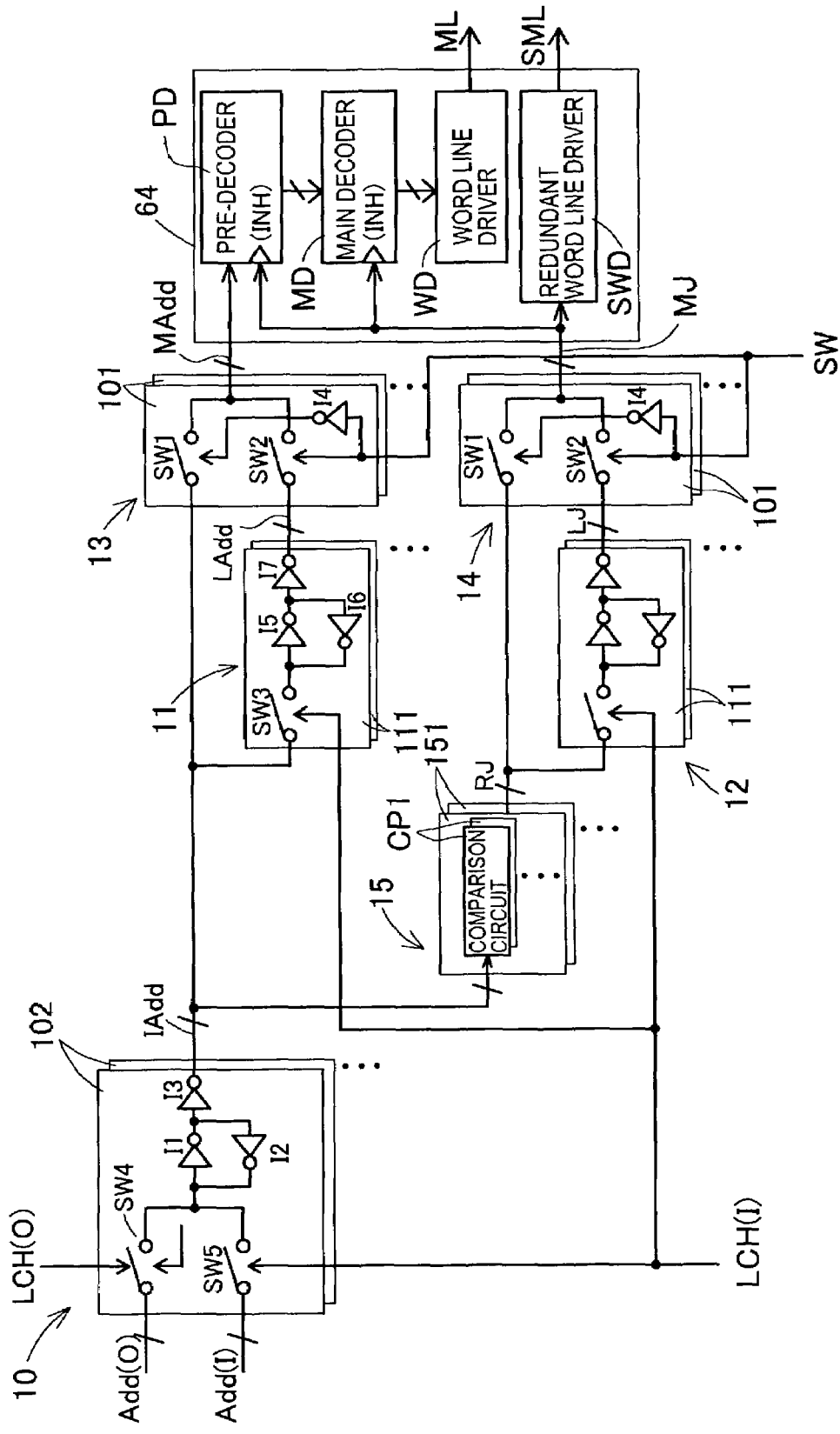
FIG. 12 is a circuit block diagram of a specific example directed to the Third Embodiment.

FIG. 12 shows a concrete example with respect to the circuit construction at the latter stage from the address switching section 10 of the third embodiment. The address switching section 10 is constructed by a switching circuit 102 instead of the switching circuit 101 in the concrete example (FIG. 2) of the first embodiment. Each switching circuit 102 has switch sections SW4, SW5 for switching each address bit information of the data access address Add(O), and each address bit information of the refresh address Add(I). The operations of the respective switch sections SW4, SW5 are controlled by control signals LCH(O), LCH(I). The data access address Add(O) and the refresh address Add(I) fetched through the switch sections SW4, SW5 are latched to a latch section constructed by mutually connecting the input and output terminals of inverter gates I1, I2. The address bit information latched to the latch section is outputted to the internal address bus IAdd through the inverter gate I3.

The operations of each switch section SW3 of the internal address storing section 11 and each switch section SW3 of the internal-address-redundancy-judgment-result storing section 12 are controlled by the control signal LCH(I). The address information is stored in synchronization with the selection of the refresh address Add(I) in the address switching section 10.

Figure 13:
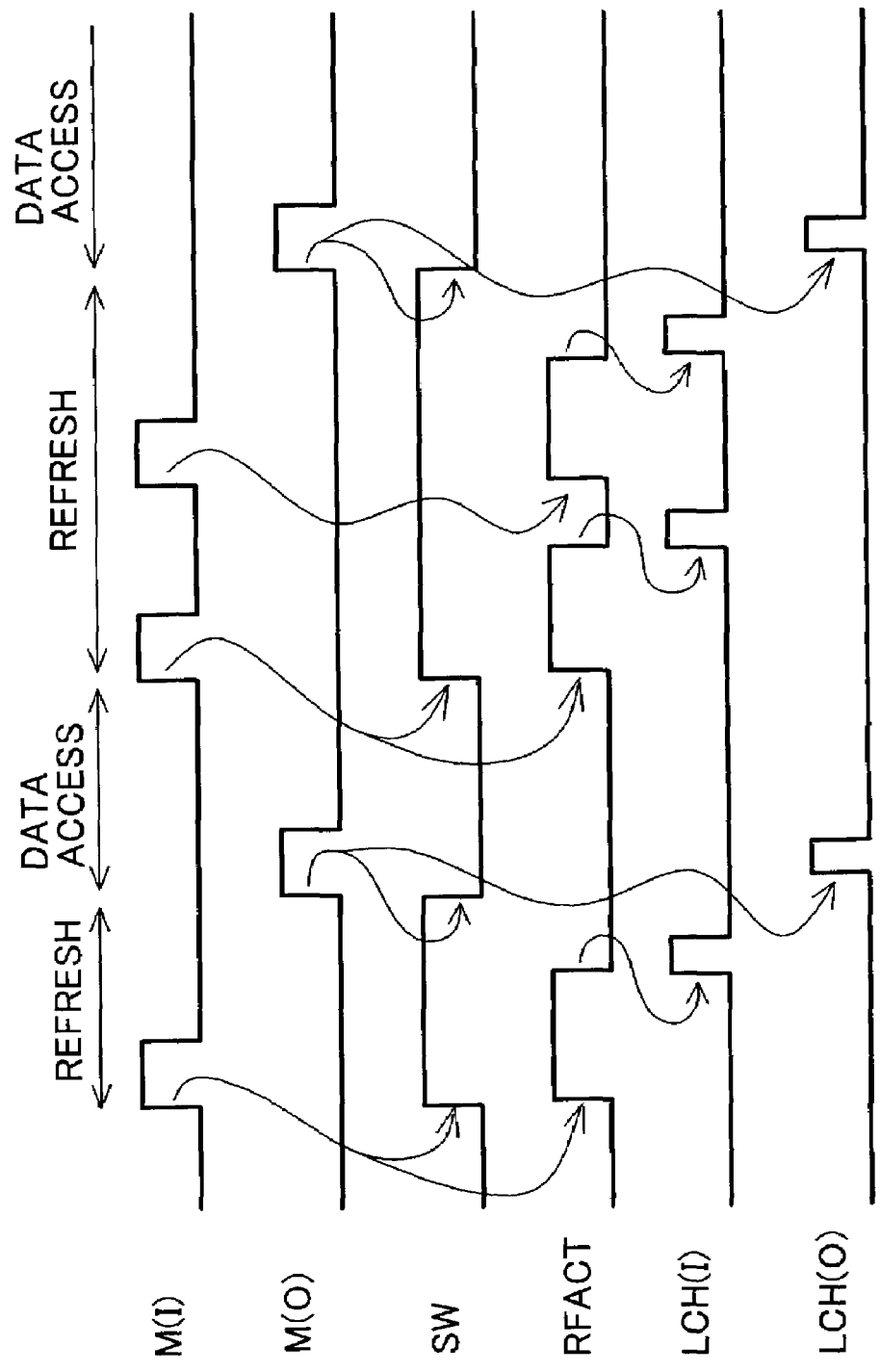
FIG. 13 shows an operational waveform diagram showing switch of operation modes according to the Third Embodiment.

FIG. 13 shows operational waveforms of the control signals LCH(O), LCH(I), SW with respect to the mode signals M(O), M(I) in the operation of the semiconductor memory device in the third embodiment. In FIG. 13, the mode signals M(O), M(I) are inputted as pulse signals at high levels.

When the pulse signal of the refresh operation mode signal M(I) is inputted, the control signal SW is changed to the high level, and each switch section SW2 of each of the switching sections 13, 14 is set to a turning-on state. The stored refresh address Add(I) and redundancy judgment result RJ(I) are fetched to the word-line-driving-system circuit 64 from the stored address bus LAdd and the stored-redundancy-judgment-result bus LJ. A refresh operation activation signal RFACT is simultaneously changed to the high level by an unillustrated control circuit, and the refresh operation is started. When the refresh operation activation signal RFACT is then changed to the low level and the refresh operation is terminated, the control signal LCH(I) is outputted as a pulse and each switch section SW5 of the address switching section 10 is turned on. Thus, the refresh address Add(I) with respect to the next refresh operation is fetched to each latch section of the address switching section 10, and each switch section SW3 of each of the storing sections 11, 12 is turned on and this refresh address Add(I) is stored to each of the storing sections 11, 12.

At this time, although the Madd and MJ are changed in the pre-charge period, it is no problem because the word-line-driving-system circuit 64 has already been deactivated.

In the next operation mode, a pulse signal of the data-access-mode signal M(O) is inputted. The control signal SW is changed to the low level, and each switch section SW1 of each of the switching sections 13, 14 is set to the turning-on state. The control signal LCH(O) is simultaneously outputted as a pulse and each switch section SW4 of the address switching section 10 is turned on so that the data access address Add(O) is fetched to each latch section of the address switching section 10. The data access address Add (O) and the redundancy judgment result RJ(O) are fetched to the word-line-driving-system circuit 64 through the internal address bus IAdd and the redundancy judgment result bus RJ.

The refresh operation is next continuously performed. In this case, the pulse signal of the refresh operation mode signal M(I) is continuously outputted. Thus, the control signal SW is maintained at the high level, and the stored address bus LAdd and the stored-redundancy-judgment-result bus LJ are continuously selected. This state is continued until the data-access-mode signal M(O) is inputted and the control signal SW is changed to the low level. The control signal LCH(I) is outputted as a pulse every operation mode signal M(I). This is because the refresh address Add(I) is updated every refresh operation, and is stored to each of the storing sections 11, 12.

Figure 14:
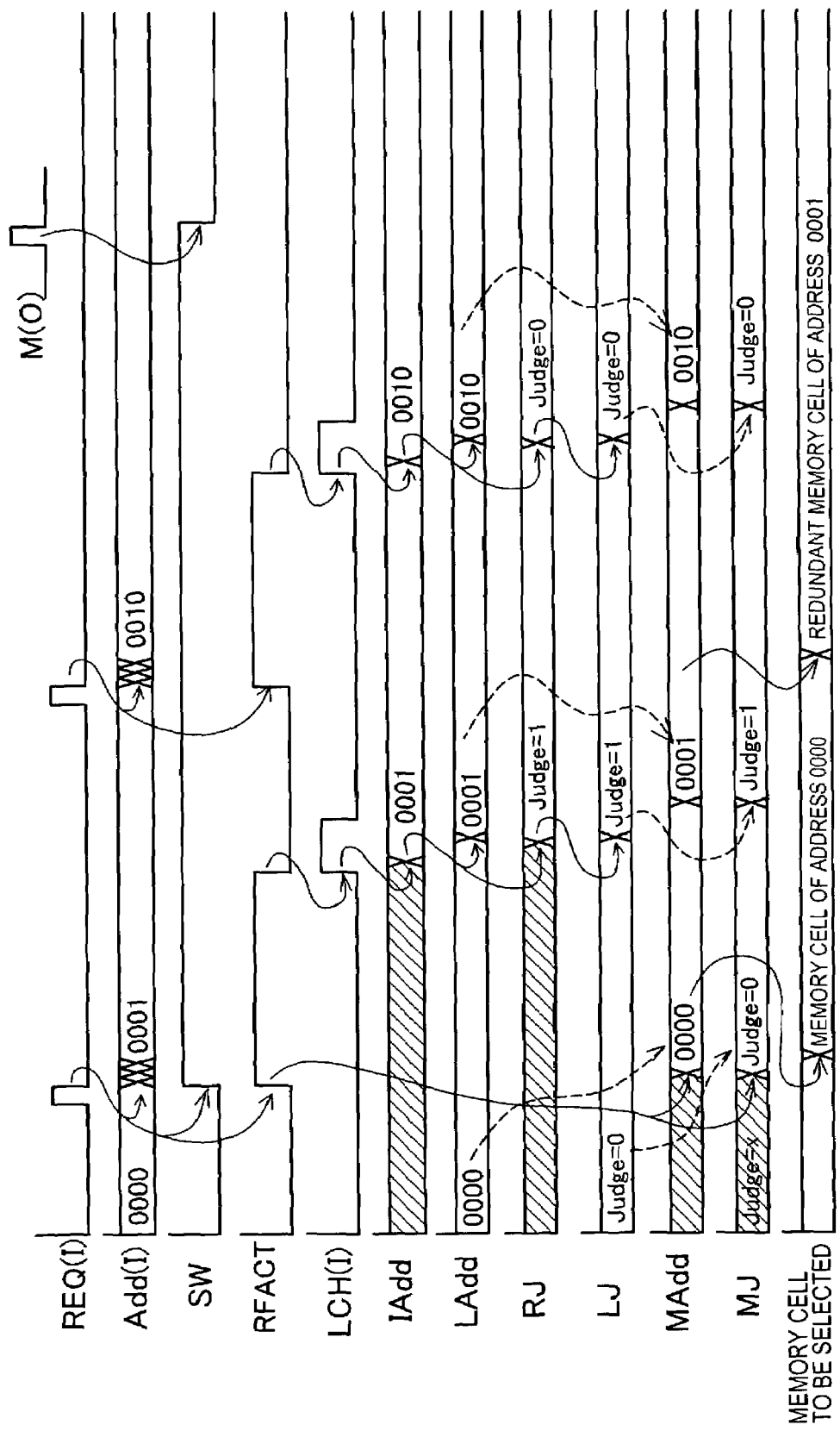
FIG. 14 is an operational waveform diagram (1) in case refresh operation mode directed to the Third Embodiment continues.
Figure 15:
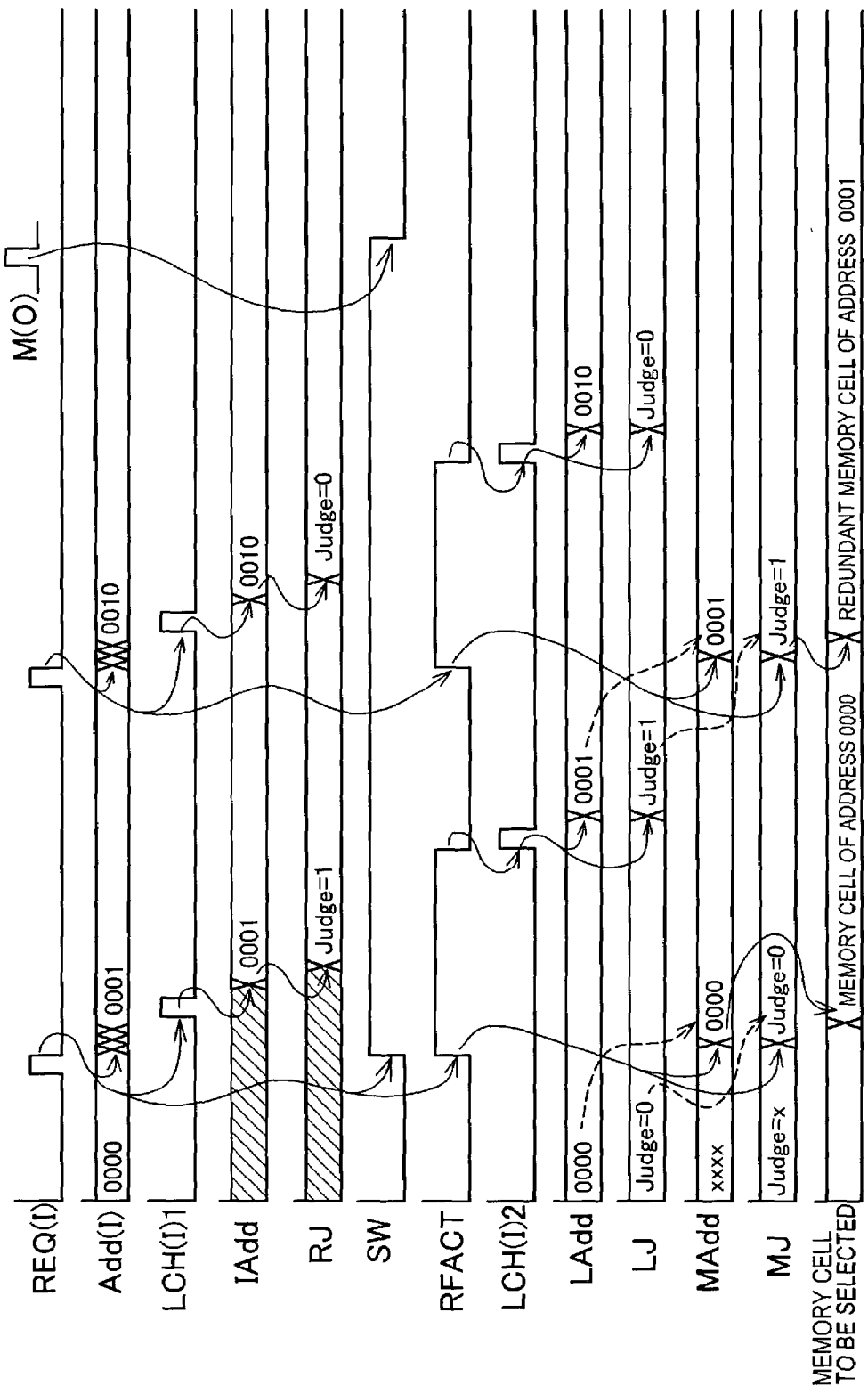
FIG. 15 is an operational waveform diagram (2) in case refresh operation mode directed to the Third Embodiment continues.

FIGS. 14 and 15 show operational waveforms when the refresh operation mode is continued with respect to the operation of the semiconductor memory device in the third embodiment. FIG. 14 shows a case in which the operations of the address switching section 10 and each of the storing sections 11, 12 are controlled by the control signal LCH(I) in the refresh operation. FIG. 15 shows a case in which the operation of the address switching section 10 is controlled by a control signal LCH(I)1 and the operation of each of the storing sections 11, 12 is controlled by a control signal LCH(I)2 in the refresh operation mode.

In the operational waveforms of FIG. 14, the control signal SW is maintained at the high level in the continuing state of the refresh operation mode. Accordingly, no unnecessary address information is propagated to the access-objective address bus MAdd and the access-objective-redundancy-judgment-result bus MJ even in the pre-charge period after the operation period of each refresh operation mode is terminated. The control signal LCH(I) is operated as a pulse at the terminating time of the operation period of each refresh operation, and the refresh address Add(I) is latched to the latch section of the address switching section 10. Accordingly, no unnecessary address information is propagated to the internal address bus IAdd in the pre-charge period. Further, the storing operation of the address information to each of the storing sections 11, 12 is also performed as one pulse operation.

In the operational waveforms of FIG. 15, similar to the case of FIG. 14, the control signal SW is maintained at the high level in the continuing state of the refresh operation mode, and no unnecessary address information is propagated to the access-objective address bus MAdd and the access-objective-redundancy-judgment-result bus MJ even in the pre-charge period after the operation period of each refresh operation mode is terminated. Further, the control signal LCH(I)1 is operated as a pulse during the operation period of each refresh operation, and the refresh address Add(I) is latched to the latch section of the address switching section 10, and no unnecessary address information is propagated to the internal address bus IAdd in the subsequent pre-charge period, etc. Further, similar to the control signal LCH(I) of FIG. 14, the control signal LCH(I)2 is operated as a pulse at the terminating time of the operation period of each refresh operation, and the storing operation of the address information to each of the storing sections 11, 12 is performed. No unnecessary address information is stored in the subsequent pre-charge period, etc.

As explained above in detail, in accordance with the semiconductor memory device and its control method in the third embodiment, there is no case in which the address setting becomes indefinite in the pre-charge period, and the input of an unnecessary address and the redundancy judgment operation with respect to this address are performed. Accordingly, unnecessary electric current consumption caused by the unnecessary circuit operation can be restrained. Further, the electric current consumption can be effectively reduced when the address bit number and the redundancy construction are increased as capacity is increased.

Further, since the storing operation of the address information to each of the storing sections 11, 12 is performed by one pulse operation, an error in the storage of the address information can be prevented by performing the storing operation in suitable timing having a small voltage change, etc.

Here, the switching timing of the control signals LCH(O), LCH(I), LCH(I)1, LCH(I)2 or the timing of the pulse output is preferably set to timing after the address information is established in the data access address bus Add(O), the refresh address bus Add(I), the internal address bus IAdd and the redundancy judgment result bus RJ. Further, the switching timing of the control signal SW, or the timing of the pulse output is preferably set to timing after the address information is established in the internal address bus IAdd and, the redundancy judgment result bus RJ, or is preferably set to timing after the refresh address Add(I) and the redundancy judgment result RJ(I) are completely stored to each of the storing sections 11, 12. Thus, no indefinite address information is propagated before the address information is established or stored.

Figure 16:
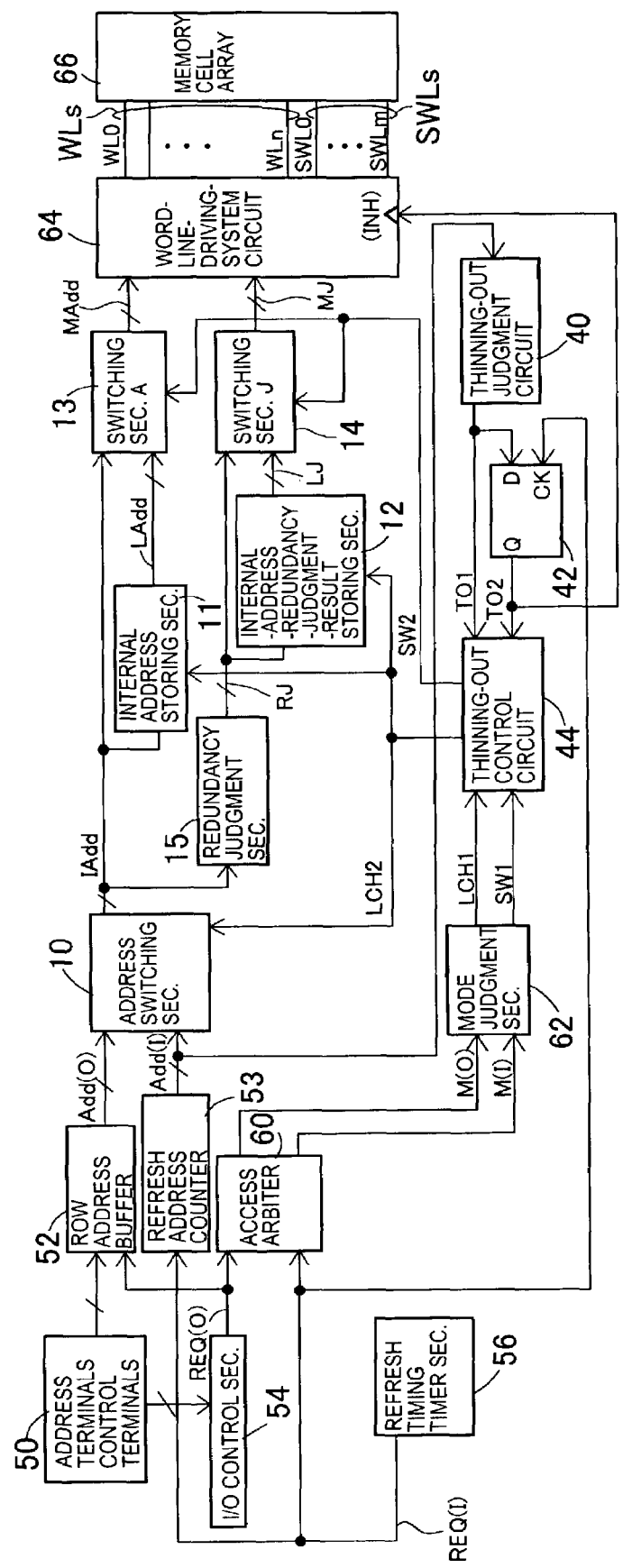
FIG. 16 is a circuit block diagram directed a Fourth Embodiment.

In a fourth embodiment shown in FIG. 16, a thinning-out judgment circuit 40, a flip-flop circuit 42 and a thinning-out control circuit 44 are arranged in addition to the first embodiment (FIG. 1). The refresh address Add(I) is inputted to the thinning-out judgment circuit 40 to judge whether the refresh operation is executed or not in accordance with the data storing characteristics of a memory cell measured in advance. With respect to the memory cell having preferable data storing characteristics, it is not necessary to execute the refresh operation every time, but it is sufficient to execute one refresh operation every predetermined number of refresh requests. The thinning-out judgment circuit 40 is a circuit for judging whether this execution is performed or not.

A first judgment result signal TO1 is inputted to the thinning-out control circuit 44, and is also inputted to an input terminal D of the flip-flop circuit 42. The flip-flop circuit 42 is a D-type flip-flop, and the first judgment result signal TO1 is fetched to the flip-flop circuit 42 with the refresh request signal REQ(I) as a trigger. The flip-flop circuit 42 outputs a second judgment result signal TO2 to the thinning-out control circuit 44. The refresh address Add(I) with respect to the next refresh operation is outputted by the refresh address Add(I) with respect to the output of the refresh request signal REQ(I). Accordingly, the second judgment result signal TO2 becomes a judgment with respect to the address Add(I) in the refresh operation mode this time. The first judgment result signal TO1 becomes a judgment of the address Add(I) with respect to the next refresh operation mode.

Control signals LCH1, SW1 from the mode judgment section 62 are inputted to the thinning-out control circuit 44 in addition to the first and second judgment result signals TO1, TO2. The control signals LCH1, SW1 are controlled by the first and second judgment result signals TO1, TO2, and are outputted as control signals LCH2, SW2 so that the operations of the address switching section 10, each of the storing sections 11, 12 and each of the switching sections 13, 14 are controlled.

Figure 17:
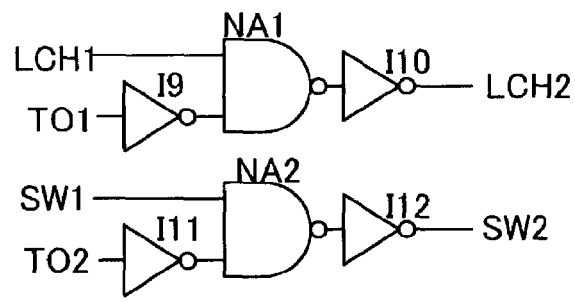
FIG. 17 shows a specific example of a thinning-out control circuit.

FIG. 17 shows a concrete example of the thinning-out control circuit 44. The first judgment result signal TO1 is inputted to an inverter gate I9, and the output of the inverter gate I9 is inputted to a NAND gate NA1 together with the control signal LCH1. The output of the NAND gate NA1 is inverted by an inverter gate I10, and is outputted as the control signal LCH2. The second judgment result signal TO2 is inputted to an inverter gate I11, and the output of the inverter gate I11 is inputted to a NAND gate NA2 together with the control signal SW1. The output of the NAND gate NA2 is inverted by an inverter gate I12, and is outputted as the control signal SW2.

Figure 18:
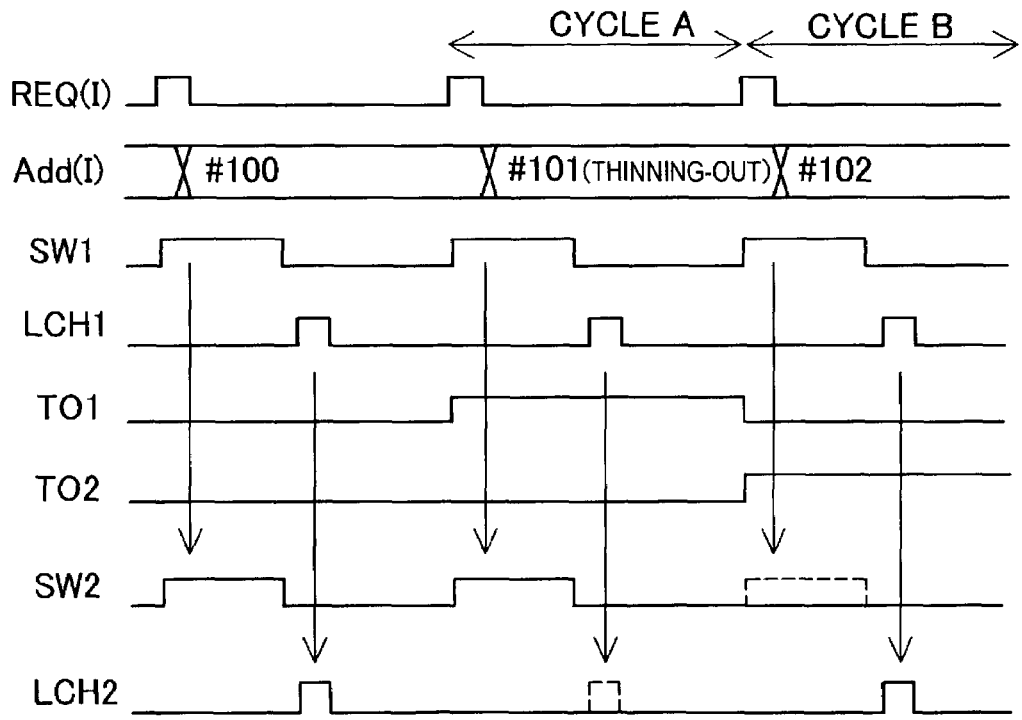
FIG. 18 is an operation waveform diagram of the Fourth Embodiment.
Figure 19:
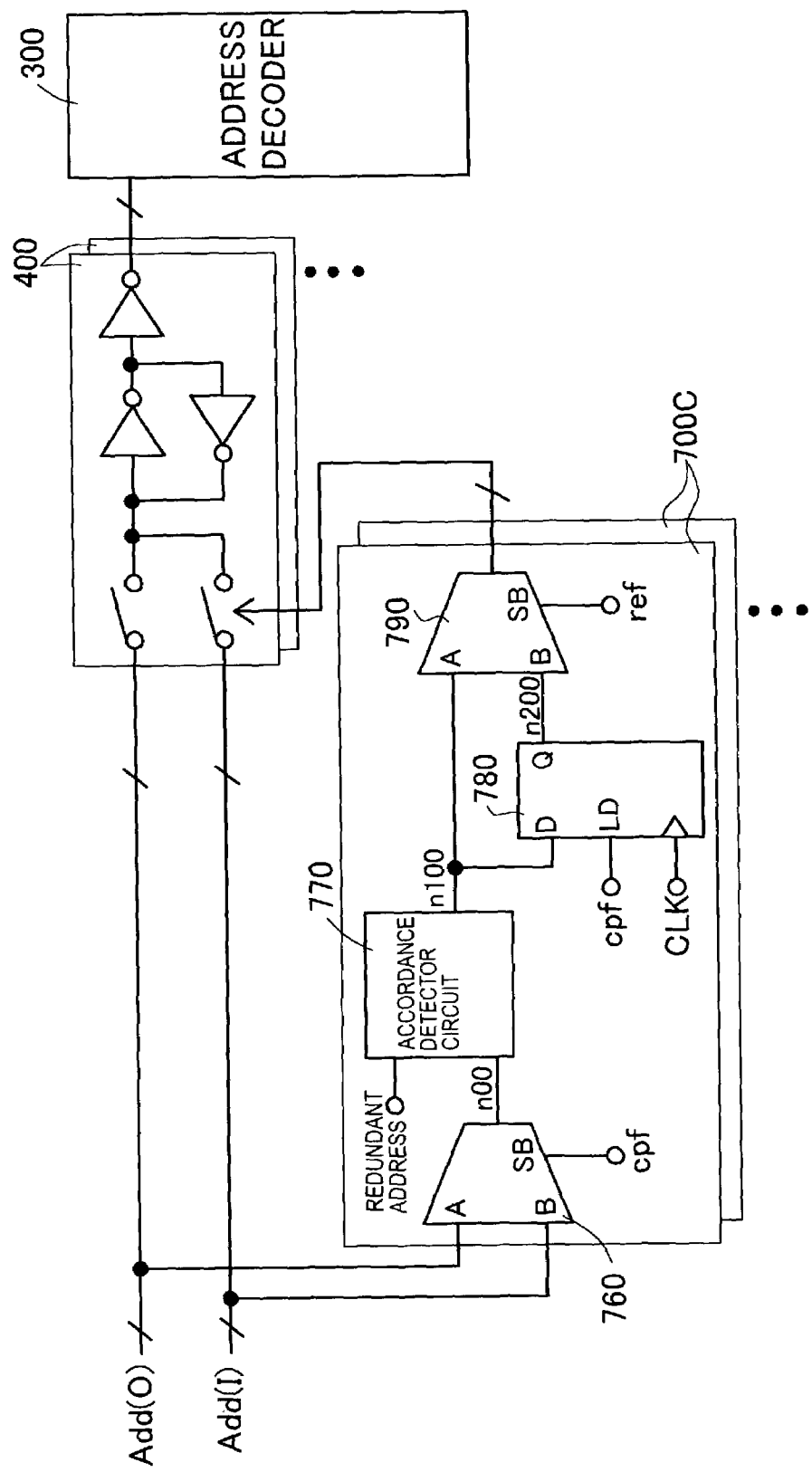
FIG. 19 is a circuit block diagram of Prior Art.

FIG. 18 shows operational waveforms when the refresh operation mode is continued with respect to the fourth embodiment. The refresh address counter 53 is counted up by the refresh request signal REQ(I), and refresh addresses (#100) to (#102) are outputted. Control signals LCH1, SW1 are simultaneously outputted from the mode judgment section 62. The control signals LCH1, SW1 in this case are signals similar to the control signals LCH, SW of the first embodiment. In the fourth embodiment, the control signals LCH1, SW1 are controlled by the thinning-out control circuit 44.

Since no refresh address (#100) is a thinning-out object in the first refresh operation mode, both the first and second judgment result signals TO1, TO2 are set to the low level. Since the NAND gates NA1, NA2 function as logic inversion gates from FIG. 17, the control signals LCH2, SW2 are outputted as signals of the same phase as the control signals LCH1, SW1, and the normal refresh operation and the storing operation of the address information with respect to the refresh address (#100) are performed.

In a cycle A as the next refresh operation mode, it is judged that the refresh address (#101) is a thinning-out address. The first judgment result signal TO1 is changed to the high level, and the output of the NAND gate NA1 of FIG. 17 is fixed to the high level. Accordingly, the control signal LCH2 is fixed to the low level, and the fetch operation of the refresh address (#101) using the address switching section and the storing operation to each of the storing sections 11, 12 are not performed. Namely, the address information with respect to the refresh address (#100) is maintained as it is in each of the storing sections 11, 12. At this time, since the second judgment result signal TO2 is maintained at the low level, the refresh address (#100) is read from each of the switching sections 13, 14 and the refresh operation is performed.

In a cycle B as the next refresh operation mode, it is judged that no refresh address (#102) is a thinning-out address. The first judgment result signal TO1 is changed to the low level, but the second judgment result signal TO2 is changed to the high level. Therefore, the output of the NAND gate NA2 of FIG. 17 is fixed to the high level. Accordingly, the control signal SW2 is fixed to the low level, and no address information is read from each of the switching sections 13, 14, and no refresh operation is performed. At this time, since the first judgment result signal TO1 is maintained at the low level, the fetch operation of the refresh address (#102) using the address switching section 10 and the storing operation to each of the storing sections 11, 12 are performed.

As explained above in detail, in accordance with the semiconductor memory device and its control method in the fourth embodiment, the refresh operation mode as a second operation mode is not performed with respect to the refresh address Add(I) as a second address judged as non-execution. Accordingly, it is possible to inhibit the storage of the refresh address Add(I) to the internal address storing section 11, the redundancy judgment using the redundancy judgment section 15, and the storing operation of the redundancy judgment result with respect to the refresh address Add(I) to the internal-address-redundancy-judgment-result storing section 12 prior to the refresh operation mode. It is also possible to inhibit the selections of the switching section A(13) and the switching section J(14) as the first and second switching sections. Accordingly, the electric current consumption caused by an unnecessary circuit operation can be reduced. The electric current consumption can be effectively reduced when the address bit number and the redundancy construction are increased as capacity is increased.

The present invention is not limited to the above embodiments, but can be variously improved and modified within the scope not departed from the spirit of the present invention.

For example, the control every bank shown in the first embodiment, and the layout arrangement examples shown in the first and second embodiments can be similarly applied to the other embodiments.

In accordance with the present invention, the address information can be stored to the storing section by one pulse operation in timing having a small peripheral noise, and the storage of incorrect information due to the influence of the noise can be prevented. Further, it is possible to provide a semiconductor memory device and its control method able to increase the speed of the data access and improve the data transfer rate by shortening the refresh operation cycle while a low consumed electric current operation is performed by, limiting the switching operation of the address information to a required minimum limit.

What is claimed is:

1. A semiconductor memory device equipped with a first operation mode that conducts an access operation when a first address is designated as object of access at every address access and a second operation mode that conducts an access operation in asynchronous with the first operation mode when a second address is designated as object of access at every address access in accordance with a predetermined procedure,
wherein the semiconductor memory device comprises:
an address storing section for storing the second address to be designated in next time of the second operation mode in accordance with a control signal generated in advance of the next time of the second operation mode, the address storing section being connected to an internal address bus;
a redundancy-judgment-result storing section for storing a redundancy judgment result of the second address to be designated in the next time of the second operation mode in accordance with the control signal generated in advance of the next time of the second operation mode, the redundancy-judgment-result storing section being connected to a redundancy-judgment-result bus;
a first switching section for selecting the internal address bus or the address storing section when the access operation is made in the first operation mode or the second operation mode; and
a second switching section for selecting the redundancy-judgment-result bus or the redundancy-judgment-result storing section when the access operation is made in the first operation mode or the second operation mode.

2. A semiconductor memory device according to claim 1, wherein, under the second operation mode, storing operations toward the address storing section and the redundancy-judgment-result storing section are conducted after the first and second switching sections make their respective selection.

3. A semiconductor memory device according to claim 1, wherein the first operation mode is data-input/output operation and the first address is an external address inputted from an external.

4. A semiconductor memory device according to claim 1, wherein the second operation mode is refresh operation and the second address is an internal address generated at an internal.

5. A semiconductor memory device according to claim 1, wherein at least either one of the address storing section and the redundancy-judgment-result storing section is arranged such that its output signal path is shorter than its input signal path when circuits of the semiconductor memory device are arranged.

6. A semiconductor memory device according to claim 1, wherein at least either one of the first switching section and the second switching section is arranged such that its output signal path is shorter than its input signal path when layout arrangement is carried out.

7. A semiconductor memory device according to claim 1 further comprising a pre-decoding section for pre-decoding at least either one of the first address and the second address, wherein the internal address bus and the redundancy-judgment-result bus receive a pre-decoded address and a redundancy judgment result with respect to the pre-decoded address.

8. A semiconductor memory device according to claim 7, wherein the pre-decoding section is arranged such that its output signal path is shorter than its input signal path when layout arrangement is carried out.

9. A semiconductor memory device according to claim 1 further comprising a memory cell region divided into a plurality of banks, wherein at least either one of the first switching section and the second switching section is provided for each of the banks and activated along with activation of each of the banks.

10. A semiconductor memory device according to claim 1 further comprising an address switching section for establishing an address path that outputs the first address or the second address to the internal address bus,
wherein setting of the first or second operation mode is made every operation cycle composed of a unit of operation period of the first or second operation mode and non-operation period that is from termination of the operation period until start of next time of the operation period, and
wherein, in case operation mode is switched between the first or the second operation modes, the address switching section executes switching of the address path along with only first switching timing that is taken after start of the operation cycle.

11. A semiconductor memory device according to claim 10,
wherein, in case operation mode is switched to the first operation mode, the first switching timing is taken after establishment of the first address to be inputted to the address switching section, and
in case operation mode is switched to the second operation mode, the first switching timing is taken after selection of the address storing section and the redundancy-judgment-result storing section by the first and second switching sections.

12. A semiconductor memory device according to claim 1 further comprising an address switching section that fetches and latches the first address or the second address and then outputs a latched address to the internal address bus,
wherein setting of the first or second operation mode is made every operation cycle composed of a unit of operation period of the first or second operation mode and non-operation period that is from termination of the operation period until start of next time of the operation period, and
wherein the address switching section fetches and latches the first address or the second address with only first fetch timing that is taken after start of the operation cycle.

13. A semiconductor memory device according to claim 12, wherein the first fetch timing is taken after establishment of the first address to be inputted to the address switching section in case the first address is fetched, and the first fetch timing is taken after selection of the address storing section and the redundancy-judgment-result storing section by the first and second switching sections in case the second address is fetched.

14. A semiconductor memory device according to claim 1,
wherein setting of the first or second operation mode is made every operation cycle composed of a unit of operation period of the first or second operation mode and non-operation period that is from termination of the operation period until start of next time of the operation period, and
wherein, in case operation mode is switched between the first or the second operation modes, the first switching section and the second switching section execute switching between the internal address bus or the address storing section and the redundancy-judgment-result bus or the redundancy-judgment-result storing section along with only second switching timing that is taken after start of the operation cycle.

15. A semiconductor memory device according to claim 14,
wherein in case operation mode is switched to the first operation mode, the second switching timing is taken after establishment of the first address at the internal address bus and redundancy-judgment result of the first address at the redundancy-judgment-result bus, and
in case operation mode is switched to the second operation mode, the second switching timing is taken after start of the operation cycle.

16. A semiconductor memory device according to claim 1,
wherein setting of the first or second operation mode is made every operation cycle composed of a unit of operation period of the first or second operation mode and non-operation period that is from termination of the operation period until start of next time of the operation period,
the first switching section includes a first latch section that fetches and latches an output from the internal address bus or the address storing section,
the second switching section includes a second latch section that fetches and latches an output from the redundancy-judgment-result bus or the redundancy-judgment-result storing section, and
the internal address bus or the address storing section and the redundancy-judgment-result bus or the redundancy-judgment-result storing section are selected along with only second fetch timing that is taken after start of the operation cycle.

17. A semiconductor memory device according to claim 16,
wherein, in case the first address at the internal address bus and a redundancy-judgment result of the first address at the redundancy-judgment-result bus are fetched, the second fetch timing is taken after establishment of the first address and a redundancy-judgment result of the first address, and
in case the second address at the address storing section and a redundancy-judgment result of the second address at the redundancy-judgment-result storing are fetched, the second fetch timing is taken after start of the operation cycle.

18. A semiconductor memory device according to claim 1 further comprising a permission/inhibition judgment section for judging permission/inhibition of execution in the second operation mode to be done for each of the second address, wherein in case the permission/inhibition judgment section makes an inhibition judgment to the second address, supply of the second address to the internal address bus is inhibited to deactivate the control signal and while the second operation mode is not executed, selection of the first switching section and the second switching section is inhibited.

19. A semiconductor memory device equipped with an external access operation mode executed based on an external access request from an external and internal access operation mode executed based on an internal access request automatically generated in the internal, the external access operation mode and the internal access operation mode being executed asynchronously, wherein the semiconductor memory device comprises:
an arbiter section for arbitrating between the external access request and the internal access request and outputting an external-operation-mode signal or an internal-operation-mode signal in accordance with the external access operation mode or the internal access operation mode;
a mode judgment section for outputting at least two kinds of signals, namely, a first control signal controlled in advance and a second control signal controlled posterior to the first control signal, based on the external-operation-mode signal or the internal-operation-mode signal;
an address switching section for selecting address of either external address controlled by the second control signal and set in the external access operation mode or internal address generated in the internal access operation mode in accordance with predetermined process and outputting selected address to an internal address bus;
a redundancy judgment section for outputting a redundancy judgment result with respect to either one of the internal address or the external address in the internal address bus to a redundancy-judgment-result bus;
an address storing section for storing the internal address in accordance with the second control signal, the address storing section being connected to the internal address bus;
a redundancy-judgment-result storing section for storing the redundancy judgment result in accordance with the second control signal, the redundancy-judgment-result storing section being connected to the redundancy-judgment-result bus;
a first switching section for selecting the internal address bus or the address storing section in accordance with the first control signal; and
a second switching section for selecting the redundancy-judgment-result bus or the redundancy-judgment-result storing section in accordance with the first control signal.

20. A semiconductor memory device according to claim 19, wherein the internal address stored in the address storing section and the redundancy-judgment result of the internal address stored in the redundancy-judgment-result storing section are objects of access of the next internal access operation.

21. A semiconductor memory device according to claim 19, wherein the mode judgment section further outputs a third control signal controlled before an internal address and a redundancy-judgment result are stored in the address storing section and the redundancy-judgment-result storing section, respectively, in accordance with the second control signal, and instead of the second control signal, the third control signal controls the address switching section.

22. A semiconductor memory device according to claim 19 further comprising a pre-decoding section for pre-decoding either the internal address or the external address, the pre-decoding section being connected between the address switching section and the internal address bus.

23. A semiconductor memory device according to claim 19 further comprising:
a first pre-decoding section for pre-decoding the external address; and
a second pre-decoding section for pre-decoding the internal address;
wherein the address switching section selects either an external pre-decoded address pre-decoded by the first pre-decoding section or an internal pre-decoded address pre-decoded by the second pre-decoding section.

24. A semiconductor memory device according to claim 19, wherein setting of the external access operation mode or the internal access operation mode is made every operation cycle composed of a unit of operation period of the external or the internal access operation mode and non-operation period that is from termination of the operation period until start of next time of the operation period, and
wherein the second control signal is switched only after start of the operation cycle where operation mode is switched between the external access operation mode and the internal access operation mode and address paths at the address switching section are switched.

25. A semiconductor memory device according to claim 19, wherein setting of the external access operation mode or the internal access operation mode is made every operation cycle composed of a unit of operation period of the external or the internal access operation mode and non-operation period that is from termination of the operation period until start of next time of the operation period,
the address switching section includes a latch section, and the second control signal is outputted only after start of the operation cycle, and the address switching section fetches the external address or the internal address to latch at the latch section.

26. A semiconductor memory device according to claim 19, wherein setting of the external access operation mode or the internal access operation mode is made every operation cycle composed of a unit of operation period of the external or the internal access operation mode and non-operation period that is from termination of the operation period until start of next time of the operation period, and
the first control signal is switched only after start of the operation cycle where operation mode is switched between the external and internal access operation mode so as to switch between the internal address bus and the address storing section or between the redundancy-judgment-result bus and the redundancy-judgment-result storing section.

27. A semiconductor memory device according to claim 19, wherein setting of the external access operation mode or the internal access operation mode is made every operation cycle composed of a unit of operation period of the external or the internal access operation mode and non-operation period that is from termination of the operation period until start of next time of the operation period, and
the first switching section includes a first latch section that fetches and latches an output from the internal address bus or the address storing section,
the second switching section includes a second latch section that fetches and latches an output from the redundancy-judgment-result bus or the redundancy-judgment-result storing section, and
the first control signal is outputted only after start of the operation cycle so as to select either the internal address bus or the address storing section and either the redundancy-judgment-result bus or the redundancy-judgment-result storing section.

28. A semiconductor memory device according to claim 19 further comprising a permission/inhibition judgment section for judging permission/inhibition of execution in the internal access operation mode to be done for each of the internal address, wherein in case the permission/inhibition judgment section makes an inhibition judgment of internal access operation mode to the internal address, a set of the first control signal and the second control signal is deactivated for the internal address.

29. A control method of a semiconductor memory device equipped with a first operation mode where first address as object of access is designated with respect to each access to execute access operation, and a second operation mode where second address as object of access is designated with respect to each access to execute access operation executed in asynchronous with the first operation mode in accordance with predetermined steps, the control method comprising:
   access-objective selecting step for selecting either the first address and a redundancy judgment result of the first address or the second address and a redundancy judgment result of the second address previously stored, as object of access for the first operation mode or the second operation mode; and
   operation-objective storing step for previously storing the second address and the redundancy judgment result of the second address as object of access for next time of the second operation mode after selecting the second operation mode in the access-objective selecting step.

30. A control method of a semiconductor memory device according to claim 29, wherein the operation-objective storing step and the access-objective selecting step antecedent to the operation-objective storing step are conducted within same second operation mode.

31. A control method of a semiconductor memory device according to claim 29 further comprising pre-decode step for pre-decoding the second address as object of access in the second operation mode, wherein, in the operation-objective storing step, pre-decoded address of the second address obtained at the pre-decode step and a redundancy judgment result of the pre-decoded address instead of the second address and the redundancy judgment result of the second address are stored.

32. A control method of a semiconductor memory device according to claim 29 further comprising address supply step for supplying the first address to the access-objective selecting step or supplying the second address to the operation-objective storing step by switching,
   wherein, after start of the operation cycle where operation mode is switched between the first operation mode and the second operation mode, there is conducted at least either one of following switching operations, namely, switching of selections in the access-objective selecting step or switching of address to be supplied in the address supply step, and
   in the semiconductor memory device, setting of the external access operation mode or the internal access operation mode is made every operation cycle composed of a unit of operation period of the external or the internal access operation mode and non-operation period that is from termination of the operation period until start of next time of the operation period.

33. A control method of a semiconductor memory device according to claim 29 further comprising permission/inhibition judgment step for judging permission/inhibition of execution in the second operation mode to be done for each of the second address, wherein in case the permission/inhibition judgment section makes an inhibition judgment to the second address, executions of the access-objective selecting step and the operation-objective storing step are inhibited.

* * * * *